(12) United States Patent
Cheng

(10) Patent No.: US 9,530,943 B2
(45) Date of Patent: Dec. 27, 2016

(54) LED EMITTER PACKAGES WITH HIGH CRI

(71) Applicant: LedEngin, Inc., San Jose, CA (US)

(72) Inventor: Shifan Cheng, Milpitas, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 14/634,348

(22) Filed: Feb. 27, 2015

(65) Prior Publication Data
US 2016/0254416 A1    Sep. 1, 2016

(51) Int. Cl.
| H01L 27/15 | (2006.01) |
| H01L 33/50 | (2010.01) |
| H01L 33/26 | (2010.01) |

(52) U.S. Cl.
CPC ............ *H01L 33/502* (2013.01); *H01L 27/15* (2013.01); *H01L 27/156* (2013.01); *H01L 33/26* (2013.01)

(58) Field of Classification Search
None
See application file for complete search history.

(56) References Cited

U.S. PATENT DOCUMENTS

| 5,742,120 | A  | 4/1998  | Lin |
| 5,959,316 | A  | 9/1999  | Lowery |
| 6,016,038 | A  | 1/2000  | Mueller |
| 6,252,254 | B1 | 6/2001  | Soules et al. |
| 6,307,160 | B1 | 10/2001 | Mei et al. |
| 6,351,069 | B1 | 2/2002  | Lowery et al. |
| 6,608,332 | B2 | 8/2003  | Shimizu et al. |
| 6,614,179 | B1 | 9/2003  | Shimizu et al. |
| 6,642,652 | B2 | 11/2003 | Collins, III et al. |
| 6,680,128 | B2 | 1/2004  | Mei |
| 6,791,116 | B2 | 9/2004  | Takahashi et al. |
| 6,828,170 | B2 | 12/2004 | Roberts et al. |
| 6,833,565 | B2 | 12/2004 | Su et al. |
| 6,967,447 | B2 | 11/2005 | Lim et al. |
| 7,045,375 | B1 | 5/2006  | Wu et al. |

(Continued)

FOREIGN PATENT DOCUMENTS

| EP | 1234140 B1 | 8/2002 |
| EP | 1610593 B1 | 12/2005 |

(Continued)

OTHER PUBLICATIONS

LZC-03MC00 Data Sheet Rev 5.2-Mar. 23, 2013) downloaded from URL <https://web.archive.org/web/20140707084758/http://www.ledengin.com/files/products/LZC/LZC-03MC00.pdf> on Feb. 4, 2016.*

(Continued)

*Primary Examiner* — Joseph Schoenholtz
(74) *Attorney, Agent, or Firm* — Kilpatrick Townsend & Stockton, LLP

(57) ABSTRACT

A color-tunable LED emitter with high CRI can be made by mounting multiple LED chips onto a ceramic substrate that has been patterned with metal contacts and paths so as to connect the LED chips into multiple independently addressable LED groups. Each LED group can produce light of a different color, allowing the color of the emitter to be tuned by adjusting the relative amount of operating current supplied to each LED group. At least some of the LED groups include LEDs coated with a broad spectrum phosphor that can reduce the sharpness of spectral peaks, thereby improving CRI and particular components of CRI, such as R9.

19 Claims, 24 Drawing Sheets

(56) References Cited

U.S. PATENT DOCUMENTS

| | | | |
|---|---|---|---|
| 7,064,353 B2 | 6/2006 | Bhat | |
| 7,066,623 B2 | 6/2006 | Lee et al. | |
| 7,156,538 B2 | 1/2007 | Han et al. | |
| 7,157,744 B2 | 1/2007 | Palmteer et al. | |
| 7,168,608 B2 | 1/2007 | Mei | |
| 7,199,446 B1 | 4/2007 | Mei et al. | |
| 7,264,378 B2 | 9/2007 | Loh | |
| 7,473,933 B2 | 1/2009 | Yan | |
| 7,670,872 B2 | 3/2010 | Yan | |
| 7,772,609 B2 | 8/2010 | Yan | |
| 8,529,791 B2 * | 9/2013 | Wu | C09K 11/7774 252/301.4 H |
| 8,598,809 B2 | 12/2013 | Negley et al. | |
| 2001/0015778 A1 | 8/2001 | Murade | |
| 2001/0050371 A1 * | 12/2001 | Odaki | C09K 11/7731 257/98 |
| 2002/0015013 A1 | 2/2002 | Ragle | |
| 2002/0079837 A1 | 6/2002 | Okazaki | |
| 2002/0163006 A1 | 11/2002 | Yoganandan et al. | |
| 2002/0191885 A1 | 12/2002 | Wu et al. | |
| 2003/0016899 A1 | 1/2003 | Yan | |
| 2003/0086674 A1 | 5/2003 | Yan et al. | |
| 2003/0095399 A1 | 5/2003 | Grenda et al. | |
| 2003/0116769 A1 | 6/2003 | Song et al. | |
| 2003/0122482 A1 | 7/2003 | Yamanaka et al. | |
| 2003/0227249 A1 | 12/2003 | Mueller et al. | |
| 2003/0230977 A1 | 12/2003 | Epstein | |
| 2004/0004437 A1 | 1/2004 | Shimizu et al. | |
| 2004/0051111 A1 | 3/2004 | Ota et al. | |
| 2004/0079957 A1 | 4/2004 | Andrews et al. | |
| 2004/0102061 A1 | 5/2004 | Watanabe | |
| 2004/0126918 A1 | 7/2004 | Kurahashi et al. | |
| 2004/0173810 A1 | 9/2004 | Lin et al. | |
| 2004/0201025 A1 | 10/2004 | Barnett et al. | |
| 2004/0257496 A1 | 12/2004 | Sonoda | |
| 2005/0035364 A1 | 2/2005 | Sano et al. | |
| 2005/0062140 A1 | 3/2005 | Leung et al. | |
| 2005/0093146 A1 | 5/2005 | Sakano | |
| 2005/0145872 A1 | 7/2005 | Fang et al. | |
| 2005/0179376 A1 | 8/2005 | Fung et al. | |
| 2005/0199900 A1 | 9/2005 | Lin et al. | |
| 2005/0224830 A1 | 10/2005 | Blonder et al. | |
| 2005/0253242 A1 | 11/2005 | Costello et al. | |
| 2005/0270666 A1 | 12/2005 | Loh et al. | |
| 2005/0286131 A1 | 12/2005 | Saxena et al. | |
| 2006/0012299 A1 | 1/2006 | Suehiro et al. | |
| 2006/0063287 A1 | 3/2006 | Andrews | |
| 2006/0082296 A1 | 4/2006 | Chua et al. | |
| 2006/0082679 A1 | 4/2006 | Chua et al. | |
| 2006/0091788 A1 | 5/2006 | Yan | |
| 2006/0097385 A1 | 5/2006 | Negley | |
| 2006/0170332 A1 | 8/2006 | Tamaki et al. | |
| 2006/0284209 A1 | 12/2006 | Kim et al. | |
| 2007/0194341 A1 | 8/2007 | Chang et al. | |
| 2007/0223219 A1 | 9/2007 | Medendorp et al. | |
| 2007/0274098 A1 | 11/2007 | Wheatley et al. | |
| 2007/0278512 A1 | 12/2007 | Loh et al. | |
| 2008/0258602 A1 | 10/2008 | Masuda et al. | |
| 2008/0308825 A1 | 12/2008 | Chakraborty et al. | |
| 2009/0014741 A1 | 1/2009 | Masuda | |
| 2010/0060185 A1 | 3/2010 | Van Duijneveldt | |
| 2010/0065864 A1 | 3/2010 | Kessels et al. | |
| 2010/0091499 A1 | 4/2010 | Jiang et al. | |
| 2010/0155755 A1 | 6/2010 | Dong | |
| 2010/0259930 A1 * | 10/2010 | Yan | F21K 9/00 362/235 |
| 2010/0308712 A1 * | 12/2010 | Liu | C04B 35/58 313/503 |
| 2011/0102706 A1 | 5/2011 | Oshio | |
| 2012/0286669 A1 * | 11/2012 | Yan | H05B 33/0869 315/151 |
| 2012/0286699 A1 * | 11/2012 | Yan | H05B 33/0866 315/294 |
| 2013/0049021 A1 | 2/2013 | Ibbetson et al. | |
| 2013/0075769 A1 * | 3/2013 | Yan | F21K 9/50 257/89 |
| 2013/0221873 A1 | 8/2013 | Weaver | |
| 2014/0042470 A1 | 2/2014 | Hsu | |
| 2014/0210368 A1 * | 7/2014 | Lee | G02B 6/0068 315/192 |
| 2016/0007419 A1 * | 1/2016 | Lee | G02B 6/0068 315/185 R |

FOREIGN PATENT DOCUMENTS

| | | | | |
|---|---|---|---|---|
| JP | 2000-349346 | | 12/2000 | |
| JP | 2000-349347 | | 12/2000 | |
| JP | 2001-057445 | | 2/2001 | |
| JP | 2002-185046 | | 6/2002 | |
| JP | 2004-241704 | | 8/2004 | |
| JP | 2004-253404 | | 9/2004 | |
| KR | 102010092686 | * | 2/2012 | H01L 33/50 |

OTHER PUBLICATIONS

Joos et al. Journal of Solid State Lighting 2014, 1:6 pp. 2-16.*
Wood, M., "CRI and the Color Quality Scale, Part 2", Out of the Wood, Spring 2010 downloaded from URL<http://www.ianiro.com/media/formato2/ianiro_515.pdf> on Feb. 4, 2016.*
Xie, Rong-Jun; Hirosaki, Naoto; Li, Yuanqiang; Takeda, Takashi. 2010. "Rare-Earth Activated Nitride Phosphors: Synthesis, Luminescence and Applications." Materials 3, No. 6: 3777-3793.*
XR6436-03 Data Sheet downloaded from URL<http://www.intematix.com/uploads/phosphor-datasheets/nitrides/XR6436-03.pdf> on Feb. 4, 2016.*
G1758 Data Sheet downloaded from URL<http://www.intematix.com/uploads/phosphor-datasheets/Silicate/G1758.pdf> on Feb. 4, 2016.*
Bailey, S, "Why the LED R9 value isn't important" Mar. 28, 2013, downloaded from URL<http://www.leapfroglighting.com/why-the-led-r9-value-isnt-important/> on Feb. 4, 2016.*
Machine translation of KR-1020100092696.*
Near, A., "Seeing Beyond CRI", LED Testing and Application, 2011, downloaded from URL<http://www.ies.org/Ida/HotTopics/LED/4.pdf> on Feb. 4, 2016.*
Consideratios for Blending LED Phosphors, Applications Note, downloaded from URL<http://www.intematix.com/uploads/application%20notes/PhosphorBlendingAppNote10Jan2013.pdf> on Feb. 4, 2016.*
Gallery White. Sep. 20, 2013, downloaded from URL<https://web.archive.org/web/20130920230548/http://www.ledengin.com/products/gallerywhite> on Feb. 4, 2016.*
Intermatix Patents Red Nitride Phosphor for LED Lighting, EETimes, Dec. 18, 2013 downloaded from URL<http://ledlighting-eetimes.com/en/intematix-patents-red-nitride-phosphor-for-led-lighting.html?cmp_id=7&news_id=222908963> on Feb. 4, 2016.*
Office Action mailed Jan. 14, 2016 in U.S. Appl. No. 13/838,812, 12 pages.
Kading, O.W., "Thermal Conduction in Metallized Silicon-Dioxide Layers on Silicon," Applied Physics, Sep. 1994, vol. 65, No. 13, pp. 1629-1631.
"Solvent Soluble Polyimide with High Transparency and High Tg: HOP-400, 500," Hitachi Cable Review, Aug. 2003, No. 22, p. 78.
Yan, Xiantao, "Two Test Specimens for Determining the Interfacial Fracture Toughness in Flip-Chip Assemblies," Jun. 1998, Transactions of the ASME, vol. 120, pp. 150-155.
Yan, Xiantao, "Analysis Based Design Guidelines for Metal Runner and Passivation Layers in IC Packaging," DELPHI Automotive Systems, Analytical Engineering Conference, May 2000, pp. 1-4.
Megumi Yoshizawa, "Japanese Institute Prototypes White LED Composed of RGB Primary Colors," Nikkei Electronics, Mar. 25, 2008, 1 page.

* cited by examiner

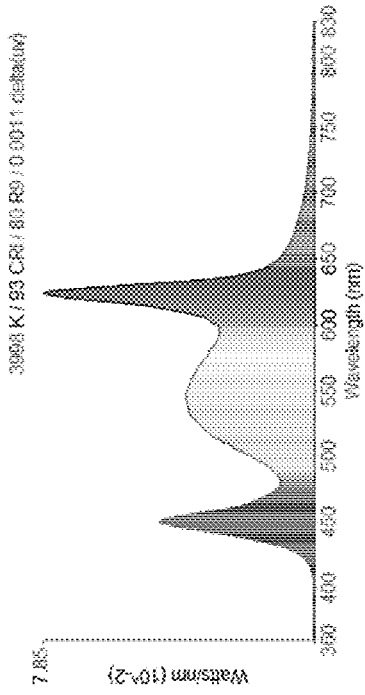
*FIG. 6B*
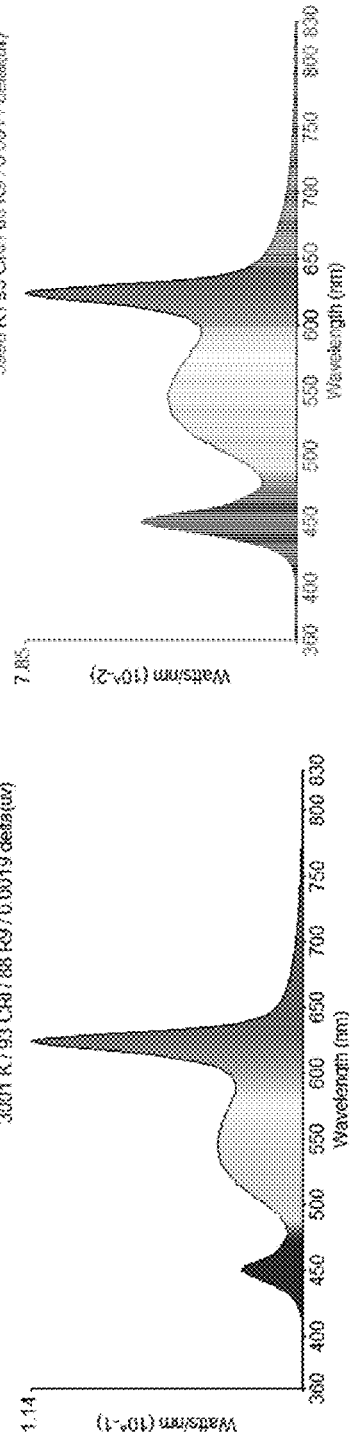
*FIG. 6A*
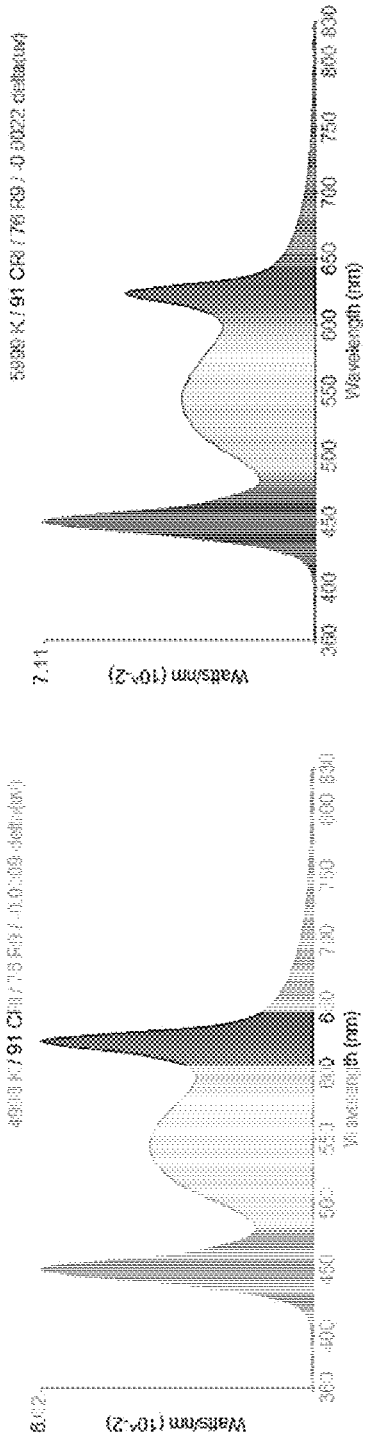
*FIG. 6D*
*FIG. 6C*

| CCT (K) | Du'v' | CRI | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|---|
| 2189 | -0.0012 | 83.6 | 76.9 | 91.7 | 84 | 71.2 | 78.9 | 79.9 | 96.3 | 90.2 | 89.7 | 93 | 60.8 | 85.5 | 79.1 | 86 | 84.7 |
| 2345 | 0.0006 | 85.7 | 80.3 | 94.8 | 82.4 | 75 | 83.1 | 85.9 | 94.9 | 89 | 88.5 | 98.7 | 67.3 | 94.5 | 83.1 | 85.6 | 86.3 |
| 2580 | 0.0039 | 89 | 85.5 | 99.3 | 80 | 80.7 | 90 | 95.3 | 92.5 | 88.9 | 90.7 | 91.4 | 76.5 | 86 | 89.1 | 84.9 | 89.4 |
| 2917 | 0.0002 | 90.6 | 87.7 | 98.8 | 83 | 85 | 92.4 | 96 | 93.6 | 88.6 | 85.6 | 92.7 | 81.9 | 83.2 | 90.8 | 87.1 | 89.1 |
| 3290 | -0.0019 | 91.1 | 89.6 | 98.7 | 82.7 | 87 | 94.3 | 96.4 | 92.9 | 87 | 80.4 | 90.5 | 85.1 | 78 | 92.8 | 87.3 | 88.4 |
| 3793 | 0.0008 | 93 | 95.2 | 96.3 | 83 | 92 | 99.5 | 93.1 | 93.6 | 91.5 | 89.2 | 84.4 | 90.6 | 69.6 | 97.9 | 88.2 | 93.3 |
| 4300 | -0.0017 | 93.3 | 97.9 | 95.2 | 83.3 | 93.7 | 98 | 91.1 | 94.3 | 93.1 | 90.8 | 82.4 | 92 | 66.5 | 99.2 | 88.8 | 94.9 |
| 4722 | 0.0010 | 92.5 | 96.3 | 92.4 | 84.1 | 94 | 92.8 | 87.6 | 95.3 | 97.7 | 92.8 | 76.8 | 91 | 60.7 | 94.5 | 89.7 | 96.9 |
| 5127 | 0.0014 | 91.3 | 94.8 | 91.6 | 84.4 | 92 | 91.9 | 86.5 | 93.7 | 95.1 | 84.3 | 75.4 | 90 | 63.8 | 93.4 | 90.1 | 96.3 |
| 5458 | 0.0004 | 91.7 | 95.5 | 91.6 | 83.6 | 93 | 93 | 86.6 | 94.1 | 96.2 | 87.2 | 75.4 | 91.2 | 63.2 | 93.9 | 89.6 | 97.5 |
| 5751 | -0.0028 | 93 | 98 | 93.7 | 83.7 | 93.8 | 95.7 | 88 | 94.3 | 96.5 | 96.6 | 79.7 | 92.4 | 65.6 | 97.3 | 89.5 | 96.8 |
| 6112 | 0.0021 | 92.7 | 92.7 | 97.2 | 84.5 | 93.6 | 94.2 | 87.3 | 94.5 | 97.1 | 90.8 | 78.7 | 91.9 | 64.4 | 96.2 | 90.2 | 98.6 |

*FIG. 7A*

| CCT (K) | Du'v' | CRI | Lumens |
|---|---|---|---|
| 2189 | -0.0012 | 83.6 | 1201 |
| 2345 | 0.0006 | 85.7 | 1144 |
| 2580 | 0.0039 | 89 | 1080 |
| 2917 | 0.0002 | 90.6 | 1191 |
| 3290 | -0.0019 | 91.1 | 1306 |
| 3793 | 0.0008 | 93 | 1388 |
| 4300 | -0.0017 | 93.3 | 1557 |
| 4722 | 0.0010 | 92.5 | 1593 |
| 5127 | 0.0014 | 91.3 | 1574 |
| 5458 | 0.0004 | 91.7 | 1426 |
| 5751 | -0.0028 | 93 | 1278 |
| 6112 | 0.0021 | 92.7 | 1209 |

FIG. 7B

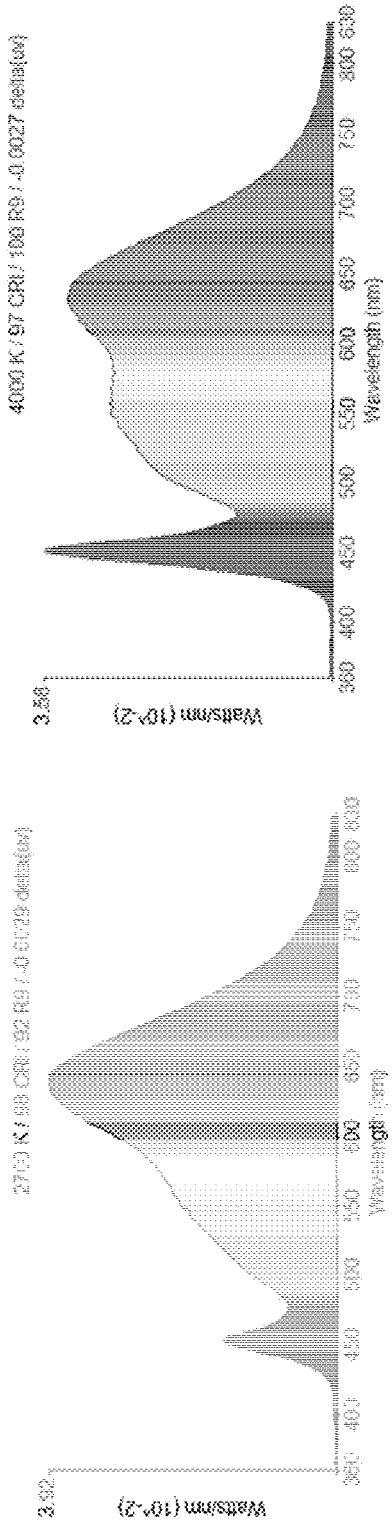
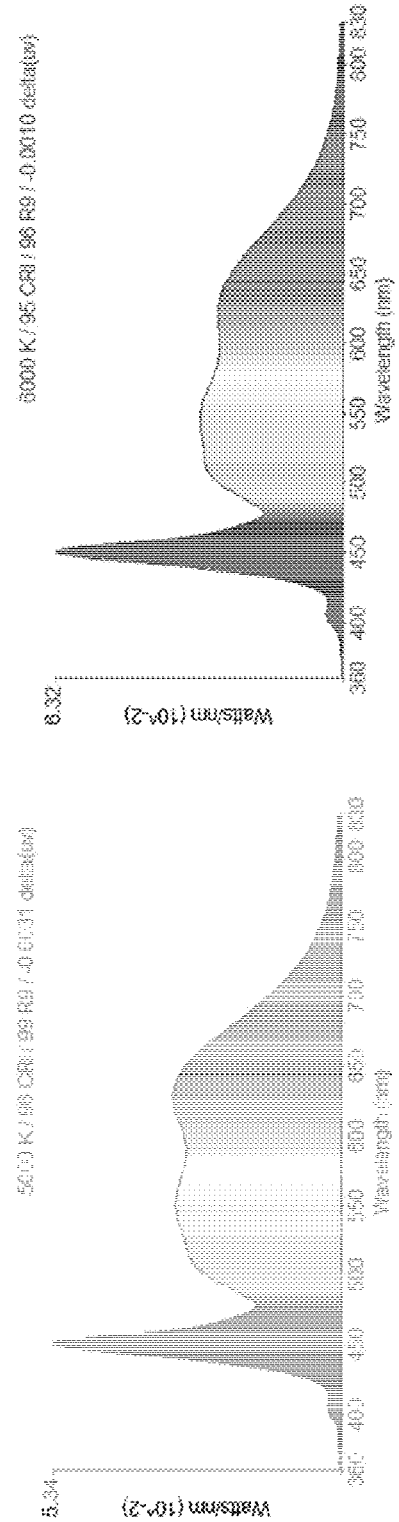
FIG. 11A
FIG. 11B
FIG. 11C
FIG. 11D

| CCT (K) | Du'v' | CRI | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|---|
| 2635 | -0.0044 | 97 | 98.4 | 97.9 | 98.1 | 98.2 | 98.3 | 94.9 | 95.5 | 94.9 | 90.5 | 97.9 | 96.2 | 87.3 | 97.9 | 97.9 | 99.4 |
| 2922 | -0.0057 | 96.8 | 97.6 | 96.8 | 97.9 | 97.9 | 98.3 | 94.4 | 95.4 | 95.9 | 94.1 | 95.7 | 96.2 | 85.4 | 96.7 | 98.8 | 98.3 |
| 3195 | -0.0061 | 97.1 | 96.7 | 97 | 97.8 | 98.2 | 97 | 94.4 | 97 | 98.9 | 97.9 | 96.3 | 95.9 | 83 | 96.3 | 98 | 96 |
| 3464 | -0.0059 | 97.2 | 96.6 | 97.1 | 97.7 | 98.7 | 97.1 | 94.6 | 97.1 | 98.8 | 96.8 | 96.3 | 96.2 | 81.3 | 96.3 | 98.1 | 95.7 |
| 3780 | -0.0052 | 97.2 | 96 | 97.4 | 96.8 | 98.9 | 97 | 95.2 | 98.5 | 97.3 | 93.4 | 97.5 | 96.7 | 78 | 96.2 | 97.4 | 94.3 |
| 4109 | -0.004 | 97.5 | 97.4 | 98.5 | 96.9 | 98.9 | 97 | 95.2 | 97.8 | 98.1 | 96.2 | 98.7 | 97.7 | 75.6 | 97.7 | 97.6 | 95.4 |
| 4344 | -0.0032 | 97.5 | 98.2 | 99 | 97.2 | 97.9 | 97 | 95.3 | 97.3 | 97.9 | 98.2 | 98.6 | 97.5 | 74.3 | 98.5 | 98 | 95.9 |
| 4639 | -0.0025 | 97.3 | 98.4 | 99.4 | 97 | 97 | 96.4 | 94.9 | 97.5 | 97.7 | 98.4 | 97.9 | 97.1 | 72.4 | 98.9 | 97.9 | 95.7 |
| 4900 | -0.0017 | 97 | 97.9 | 99.2 | 95.8 | 97.1 | 96.2 | 94.7 | 97.5 | 97.3 | 98.1 | 96 | 97.1 | 70.5 | 99.7 | 97.3 | 95.8 |
| 5203 | -0.0027 | 97.3 | 97.1 | 98.1 | 95.3 | 98.6 | 97.2 | 94.2 | 98.8 | 98.9 | 96 | 96.4 | 96.5 | 76.9 | 97.7 | 97 | 95.6 |
| 5460 | -0.0027 | 97 | 96.7 | 98.1 | 94.5 | 98.6 | 96.8 | 93.9 | 99.1 | 98.2 | 94 | 95.9 | 96.3 | 76.2 | 97.6 | 96.4 | 95.2 |
| 5726 | -0.0019 | 97.2 | 97.4 | 98.3 | 95.1 | 98.8 | 96.9 | 94 | 98.5 | 99 | 97 | 95.8 | 96.9 | 75.7 | 98.4 | 96.9 | 96.1 |
| 5990 | -0.0008 | 97.1 | 97.5 | 98.2 | 94.6 | 98.6 | 96.6 | 93.7 | 98.7 | 98.7 | 97.8 | 94.5 | 97.1 | 73.9 | 99 | 96.7 | 96.5 |
| 6147 | -0.0001 | 96.8 | 97.7 | 98.3 | 95.1 | 97.3 | 96.1 | 93.6 | 98.1 | 98.1 | 96.6 | 94.5 | 96.5 | 73.5 | 99.4 | 97.2 | 96.7 |

*FIG. 12A*

| CCT (K) | Du'v' | CRI | Lumens |
|---|---|---|---|
| 2635 | -0.0044 | 97 | 414 |
| 2922 | -0.0057 | 96.8 | 452 |
| 3195 | -0.0061 | 97.1 | 487 |
| 3464 | -0.0059 | 97.2 | 526.2 |
| 3780 | -0.0052 | 97.2 | 573.6 |
| 4109 | -0.004 | 97.5 | 625.6 |
| 4344 | -0.0032 | 97.5 | 673.7 |
| 4639 | -0.0025 | 97.3 | 747.6 |
| 4900 | -0.0017 | 97 | 824.1 |
| 5203 | -0.0027 | 97.3 | 1092 |
| 5460 | -0.0027 | 97 | 1286 |
| 5726 | -0.0019 | 97.2 | 1342 |
| 5990 | -0.0008 | 97.1 | 1291 |
| 6147 | -0.0001 | 96.8 | 1261 |

*FIG. 12B*

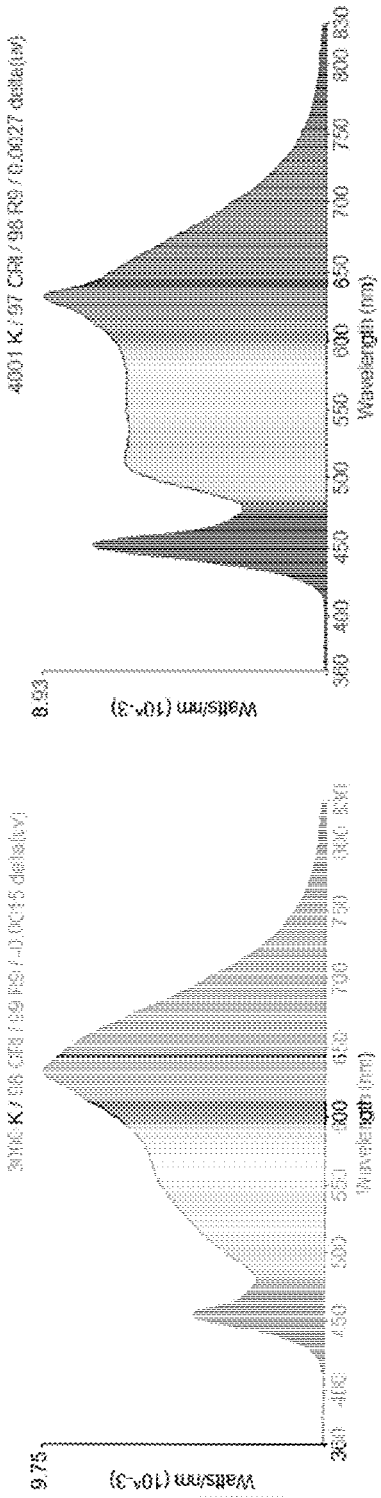
FIG. 16A
FIG. 16B
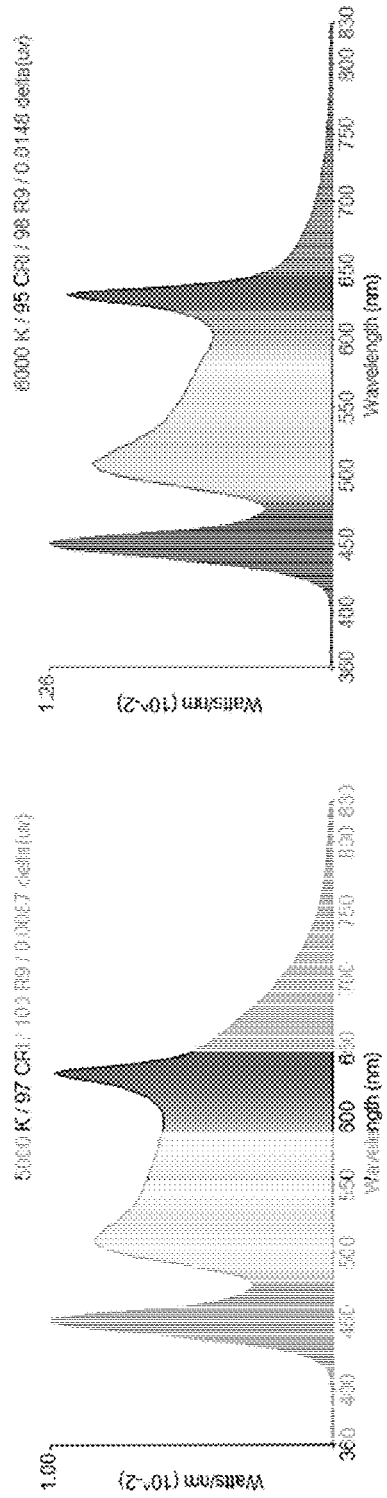
FIG. 16C
FIG. 16D

| CCT (K) | Du'v' | CRI | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|---|
| 2787 | 0.00003 | 97.7 | 97.2 | 98.8 | 97.6 | 96.4 | 97.4 | 96.5 | 99 | 98.8 | 96.3 | 98.6 | 92.8 | 89.5 | 97.3 | 97.6 | 98.6 |
| 3083 | 0.00039 | 98 | 97.8 | 99.6 | 96.7 | 96.9 | 98.1 | 97.2 | 99.1 | 98.8 | 97 | 99.5 | 93.8 | 85.7 | 98.2 | 97.3 | 98.6 |
| 3587 | -0.0026 | 97.8 | 98.7 | 98.6 | 94.3 | 98.1 | 98.5 | 95.7 | 99 | 99.6 | 97.8 | 94.9 | 95.9 | 77.6 | 99.4 | 95.9 | 98.1 |
| 4066 | 0.00013 | 97.5 | 99.1 | 97.9 | 93.5 | 97.9 | 98.4 | 95.4 | 99 | 98.9 | 99 | 93.7 | 94.8 | 75.3 | 99.4 | 95.8 | 97.6 |
| 4524 | -0.0018 | 96.5 | 99.2 | 97.2 | 92 | 97 | 97.6 | 93.5 | 97.7 | 97.8 | 96.7 | 91.4 | 94.3 | 72.9 | 99.3 | 94.9 | 97.5 |
| 4950 | -0.0021 | 95 | 98.5 | 95.4 | 89.1 | 95.1 | 97 | 91.7 | 96.4 | 96.7 | 95.5 | 87 | 92.6 | 70.1 | 97.9 | 93.3 | 98.1 |
| 5500 | 0.0034 | 94.8 | 98.8 | 94.8 | 89.7 | 93.6 | 97.9 | 92.8 | 95.2 | 95.6 | 94.8 | 87.7 | 90.5 | 74.9 | 97.5 | 94 | 98.7 |
| 6017 | 0.0072 | 94.7 | 97.3 | 94.1 | 90.8 | 93.7 | 96.6 | 93 | 95.7 | 96.2 | 96 | 87.5 | 89.8 | 74.2 | 95.8 | 94.9 | 96.7 |

FIG. 17A

| CCT (K) | Du'v' | CRI | Lumens |
|---|---|---|---|
| 2787 | 0.00003 | 97.7 | 369.6 |
| 3083 | 0.00039 | 98 | 428.2 |
| 3587 | -0.0026 | 97.8 | 594.8 |
| 4066 | 0.00013 | 97.5 | 733.7 |
| 4524 | -0.0018 | 96.5 | 934.5 |
| 4950 | -0.0021 | 95 | 958.2 |
| 5500 | 0.0034 | 94.8 | 909.8 |
| 6017 | 0.0072 | 94.7 | 832.2 |

*FIG. 17B*

LED EMITTER PACKAGES WITH HIGH CRI

BACKGROUND

The present disclosure relates generally to light-emitting devices and in particular to a color-tunable LED emitter package with high CRI across a range of color temperatures.

Light sources based on light-emitting diodes (LEDs) are emerging as an energy-efficient replacement for conventional incandescent or halogen light sources in a variety of applications. Compared to conventional light sources, LED-based light sources can provide significantly higher energy efficiency and longer life.

However, a number of challenges must be addressed to provide practical LED-based light sources. For example, a given LED emits light in a narrow band of wavelengths, which creates challenges for the production of white light (which is generally a mixture of different wavelengths). Further, not all white light is created equal. The human eye is sensitive to the differences among white-light sources such as fluorescent light, incandescent light, and sunlight. These differences can be quantified in terms of well-known metrics such as color temperature (CCT) and/or color rendering index (CRI).

SUMMARY

In terms of color quality, typical LED-based light sources suffer in comparison to incandescent and halogen light. The narrow-band emissions of LEDs tend to create a stark light with low CRI, even when multiple different colored LEDs are used in combination.

Certain embodiments of the present invention relate to color-tunable LED emitters with high CRI. An emitter can be made by mounting multiple LED chips onto a ceramic substrate that has been patterned with metal contacts and paths so as to connect the LED chips into multiple independently addressable LED groups. Each LED group can produce light of a different color, allowing the color of the emitter to be tuned by adjusting the relative amount of operating current supplied to each LED group. At least some of the LED groups include LEDs coated with a broad spectrum phosphor that can reduce the sharpness of spectral peaks, thereby improving CRI and particular components of CRI, such as R9. For example, some embodiments can provide CRI of at least 90 and R9 of at least 80 for color temperature (CCT) in a range from 2700 K to 6000 K. Some embodiments can provide CRI of at least 97 and R9 of at least 90 for CCT in a range from 2700 K to 6000 K. Some embodiments can provide CRI of at least 94 and R9 of at least 94 for CCT in a range from 2700 K to 6000 K.

The following detailed description together with the accompanying drawings will provide a better understanding of the nature and advantages of the present invention.

BRIEF DESCRIPTION OF THE DRAWINGS

FIG. 4A shows a seven-die configuration, FIG. 4B a nine-die configuration, FIG. 4C a twelve-die configuration, and FIG. 4D a twenty-five-die configuration

FIGS. 6A-6D are graphs showing representative spectra obtained for the LED groups of FIG. 5 when tuned to various CCT points along the blackbody curve.

FIG. 7A shows a table of CRI measurements and CRI components R1-R15 for the LED groups of FIG. 5 at various CCT.

FIG. 7B shows a table of CRI measurements and visible light emission (lumens) for the LED groups of FIG. 5 at various CCT.

FIG. 9A shows a seven-die configuration, FIG. 9B a nine-die configuration, FIG. 9C a twelve-die configuration, and FIG. 9D a twenty-five-die configuration

FIGS. 11A-11D illustrate representative spectra obtained for the LED groups of FIG. 10 when tuned to various CCT points along the blackbody curve.

FIG. 12A shows a table of CRI measurements for the LED groups of FIG. 10 at various CCT.

FIG. 12B shows a table of CRI measurements and visible light emission (lumens) for the LED groups of FIG. 10 at various CCT.

FIG. 14A shows a seven-die configuration, FIG. 14B a nine-die configuration, FIG. 14C a twelve-die configuration, and FIG. 14D a twenty-five-die configuration

FIGS. 16A-16D illustrate representative spectra obtained for the LED groups of FIG. 15 when tuned to various CCT points along the blackbody curve.

FIG. 17A shows a table of CRI measurements for the LED groups of FIG. 15 at various CCT.

FIG. 17B shows a table of CRI measurements and visible light emission (lumens) for the LED groups of FIG. 15 at various CCT.

DETAILED DESCRIPTION

Certain embodiments of the present invention relate to color-tunable LED emitters with high CRI. An emitter can be made by mounting multiple LED chips onto a ceramic substrate that has been patterned with metal contacts and paths so as to connect the LED chips into multiple independently addressable LED groups. Each LED group can produce light of a different color, allowing the color of the emitter to be tuned by adjusting the relative amount of operating current supplied to each LED group. At least some of the LED groups include LEDs coated with a broad spectrum phosphor that can reduce the sharpness of spectral peaks, thereby improving CRI and particular components of CRI, such as R9.

Overview of Emitter Structure

Figure 1A:
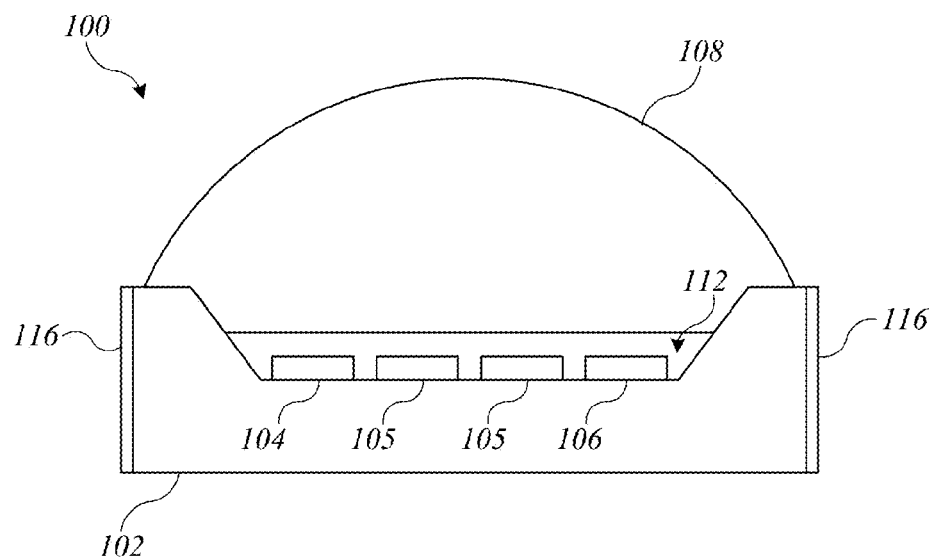
FIG. 1A is a simplified cross-sectional side view of an emitter package according to an embodiment of the present invention.
Figure 1B:
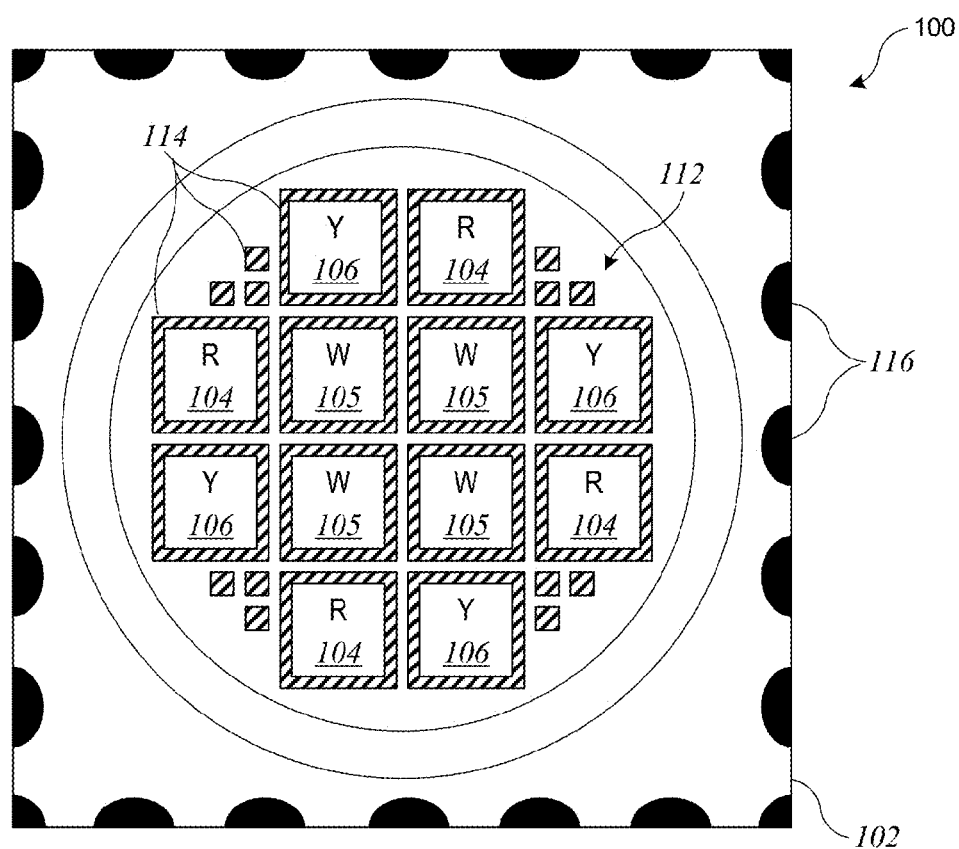
FIG. 1B is a simplified top view of am emitter package according to an embodiment of the present invention.

FIG. 1A is a simplified cross-sectional side view of emitter package 100 according to an embodiment of the present invention, and FIG. 1B is a simplified top view of emitter package 100 according to an embodiment of the present invention.

Emitter package 100 can include a single ceramic substrate 102; LED chips 104, 105, 106; and a primary lens 108. LED chips 104, 105, 106 can be light-emitting diodes that generate light of a particular frequency, and each chip can be a bare-die semiconductor device. In some embodiments, some or all of LED chips 104, 105, 106 can be coated with a wavelength-shifting material (e.g., a phosphor-containing material). Any type, color, or combination of LED chips can be used. In some embodiments, three different types of LED chips 104, 105, 106 are used. For example, as described below, LED chips 104 can be conventional red LED chips (labeled "R" in FIG. 1B) that emit light with a peak wavelength in the red region of the electromagnetic spectrum (e.g., between about 620 and 645 nm); LED chips 105 can be "greenish" LED chips (labeled "G" in FIG. 1B) that emit a broad spectrum with peak wavelength in the green or yellow region of the electromagnetic spectrum (e.g., between about 520 and 570 nm); and LED chips 106 can be "bluish" LED chips (labeled "B" in FIG. 1B) that emit a spectrum dominated by wavelengths in the blue region of the electromagnetic spectrum (e.g., between about 420 and 460 nm). Other examples are described below, and various embodiments can include three or four (or more) types of LEDs. In some embodiments, none of the LED chips are required to produce light along a blackbody locus in a color space (e.g., CIE color space). Instead, blackbody-like white light can be produced by mixing light from the various types of LED chips.

Substrate 102 can be a single-layer or multi-layer ceramic substrate. In some embodiments, substrate 102 is formed from multiple layers of a ceramic material (e.g., alumina) that are patterned with metal traces (not shown), then fused together. Vias can be formed to connect metal traces at different layers. The metal traces can provide electrical connection paths from LED chips 104, 105, 106 to peripheral contact pads 116 of substrate 102. In some embodiments, the metal traces are arranged to provide separate electrical connections to different ones of LED chips 104, 105 106, thereby allowing different operating currents to be supplied to different LED chips or groups of LED chips. This is also referred to as independent addressability. By changing the relative operating currents, it is possible to change the color of light emitted from emitter package 100. For example, red, greenish, and bluish LED chips 104, 105, 106 shown in FIG. 1B can each be connected by separate electrical paths in substrate 102 to form three independently addressable LED groups, with each group producing light of a different color or characteristic spectrum.

In some embodiments, LED chips 104, 105, 106 are disposed within a circular recess region 112 on the top surface of substrate 102. As shown in FIG. 1B, the top surface of substrate 102 within recess region 112 can be patterned with metal contact pads 114 to provide electrical connections to LED chips 104, 105, 106. In some embodiments, LEDs 104, 105, 106 can have wire-bonding contacts (not shown) on the top surface and can be electrically connected to contact pads 114 by wire bonding. In some embodiments, one or more electrical contacts for an LED chip 104, 105, 106 may be on the bottom surface of LED chip 104, 105, 106, allowing each LED chip 104, 105, 106 to be electrically connected to the contact pad 114 on which it is placed. The number and arrangement of metal contact pads 114 and LED chips 104, 105, 106 can be varied as desired.

In some embodiments, substrate 102 can be similar to substrates described in U.S. Patent Application Publication No. 2010/0259930. Other types of substrates can also be used. The dimensions of substrate 102 can be varied as desired, e.g., depending in part on the number and arrangement of LED chips 104, 105, 106. For example, substrate 102 can be square with dimensions of 0.7-5.0 cm on a side (e.g., 0.9 cm in one embodiment) and a thickness of 0.5-2.0 mm (e.g., 1.0 mm in one embodiment). In various embodiments, substrates as described herein can accommodate different numbers of LED chips, e.g., 7, 9, 12, or 25 LED chips.

Primary lens 108 can be used to focus or direct light generated by LED chips 104, 105, 106. In some embodiments, the lower portion of lens 108 is shaped to fit into and partially fill recess region 112 as shown in FIG. 1A. The remainder of recess region 112 can be filled with air or with an optically transparent material, e.g., approximately matching an index of refraction of lens 108. This material can also act as a sealant to protect LED chips 104, 105, 106 from the elements, thereby forming an emitter package. In some embodiments, one or more secondary lenses (not shown), such as a total internal reflection lens, can be used to further shape the light output from emitter 102.

Figure 2:
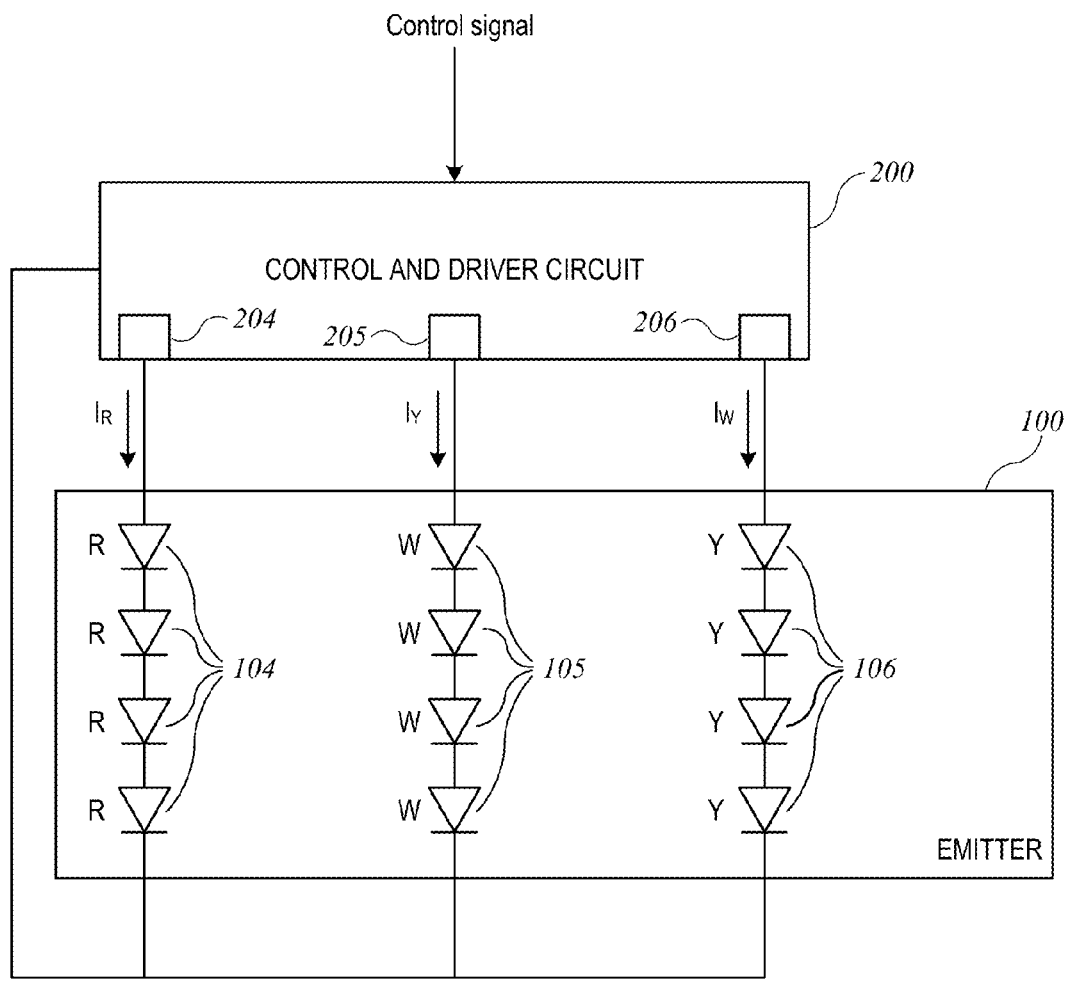
FIG. 2 is a simplified circuit diagram showing electrical connections of an emitter to a control and driver circuit according to an embodiment of the present invention.

As noted above, LED chips 104, 105, 106 can be electrically connected into independently addressable groups such that the operating current to each group can be independently varied. FIG. 2 is a simplified circuit diagram showing electrical connections of emitter 100 to a control and driver circuit 200 according to an embodiment of the present invention. As shown, control and driver circuit 200 can receive an input control signals (e.g., indicating a desired color temperature and/or brightness). Based on the control signal, control and driver circuit 200 can produce an output current on each of channels 204, 205, 206. Each channel can be varied independently, and pulse width modulation or other techniques can be used to produce the desired output currents. Each current can be delivered to a separate electrical contact 116 of emitter substrate 102 shown in FIG. 1A. As FIG. 2 shows, the electrical paths within the emitter substrate can be such that red LED chips 104 receive current $I_R$ on channel 204, whitish LED chips 105 receive current $I_W$ on channel 105, and yellowish LED chips 206 receive current $I_Y$ on channel 106. As described above, these connections can be implemented using metal contact pads 114 connected to metal traces between the layers of ceramic substrate 102 of FIGS. 1A and 1B to establish electrical paths between different groups of LED chips and different ones of peripheral contacts 116.

It will be appreciated that the emitter configuration described herein is illustrative and that variations and modifications are possible. Any number of LED chips and any number of independently-addressable groups of LED chips can be disposed on a single ceramic substrate and incorporated into an emitter package. Further, while control and driver circuit 200 is shown as being external to emitter 100, in some embodiments a control and driver circuit can be incorporated into the emitter package. A particular control and driver circuit is not required, and emitters as described herein can be driven by any number of different circuits.

The particular selection and arrangement of LED chips, including any phosphor coatings (or other wavelength-shifting material), can have a significant effect on the performance of an emitter such as emitter 100. It is generally desirable to provide high efficiency (e.g., high lumens per watt) as well as high-quality color, approximating a natural light source such as a blackbody radiator. One measure of quality of color is the widely used color rendering index (CRI), as defined by the International Commission on Illumination (CIE). CRI is a quantitative measure of how accurately an artificial light source reproduces object color across a range of colors, as compared with natural light. The artificial light source can be tested using a number of CIE standard color samples; examples used herein are based on the standard R1-R15 sample set. Of particular interest for some applications is R9 (saturated red color sample), which seems to have a strong effect on how typical observers perceive quality of light. Many existing LED emitters perform poorly in R9 color fidelity. In contrast, emitters described herein provide higher CRI and R9 and thus a more natural-appearing light.

In some embodiments, high CRI can be achieved in part by using a broad-spectrum phosphor, such as GAL (aluminate) phosphor compounds available from Intematix Corporation of Fremont, Calif. Suitable phosphors have a broad emission spectrum, e.g., full width at half maximum intensity (FWHM) of approximately 120 nm or more. As shown in examples below, the use of broad-spectrum phosphors as well as a combination of different color groups can help to smooth the spectrum of the emitter, reducing spectral peaks and valleys that may contribute to a perception of the light as stark or unnatural.

Example 1

Figure 3A:
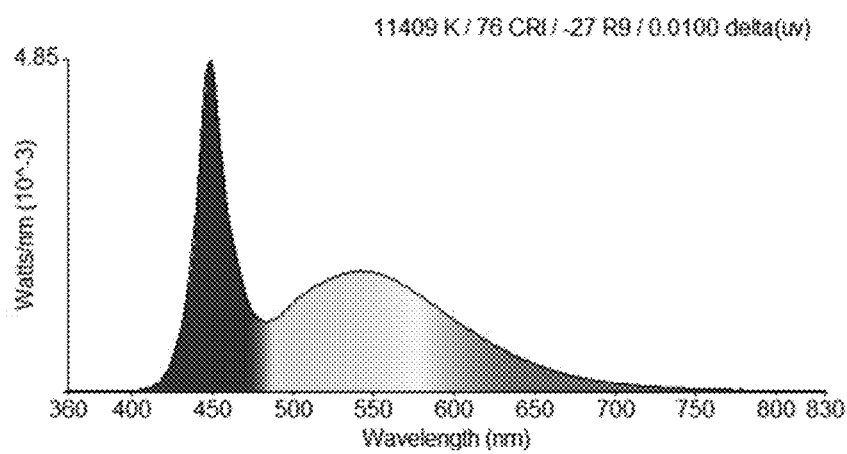
FIGS. 3A-3C are graphs showing spectra for LED groups in a emitter according to a first example embodiment of the present invention.
Figure 3B:
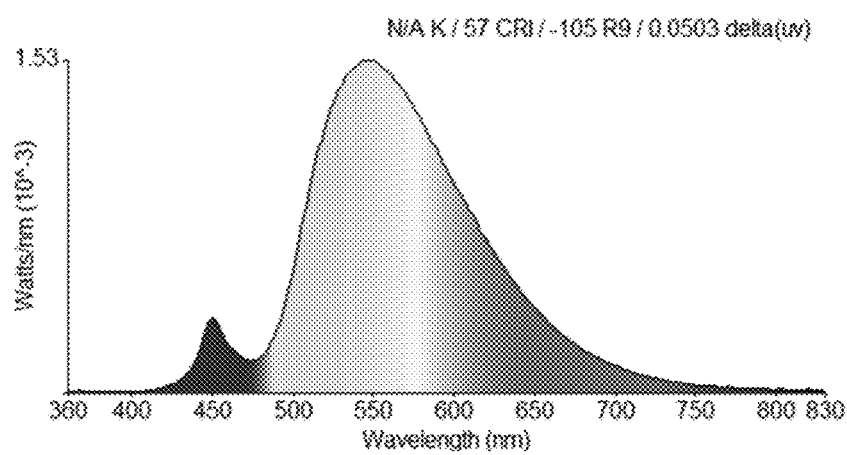
Figure 3C:
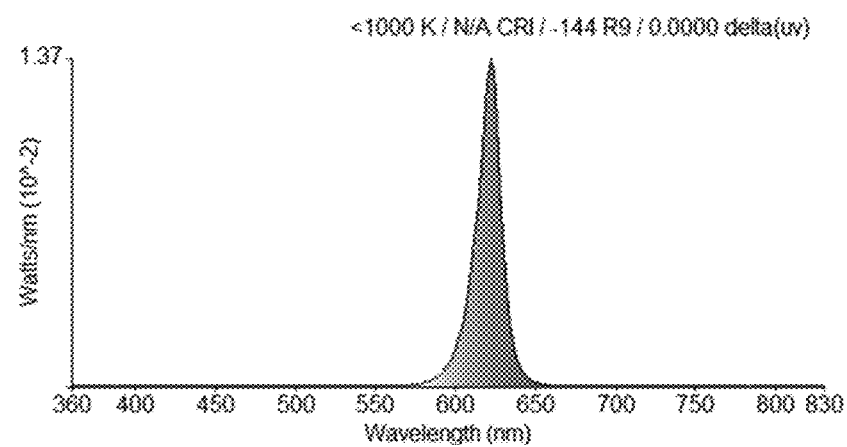

A first example of an emitter according to an embodiment of the present invention includes three groups of LEDs that produce different spectra (i.e., intensity of electromagnetic radiation as a function of wavelength), as shown in FIGS. 3A-3C. A spectrum as shown in FIG. 3A can be produced by a first (blue) LED group in which each LED is made of a 455-nm blue LED chip coated with GAL545 phosphor (available from Intematix Corporation of Fremont, Calif.) at a low concentration, such that the spectrum remains predominantly blue. A spectrum as shown in FIG. 3B can be produced by a second (green) LED group in which each LED consists of a 455-nm blue LED chip coated with GAL545 phosphor at higher concentration, such that the spectrum is dominated by green and yellow (wavelengths from about 520 nm to about 600 nm). A spectrum as shown in FIG. 3C can be produced by a third (red) LED group in which each LED consists of a red LED chip that produces a narrow spectrum with a peak wavelength at approximately 616 nm. It is to be understood that other combinations of LED chips and phosphors can be substituted.

Figure 4A:
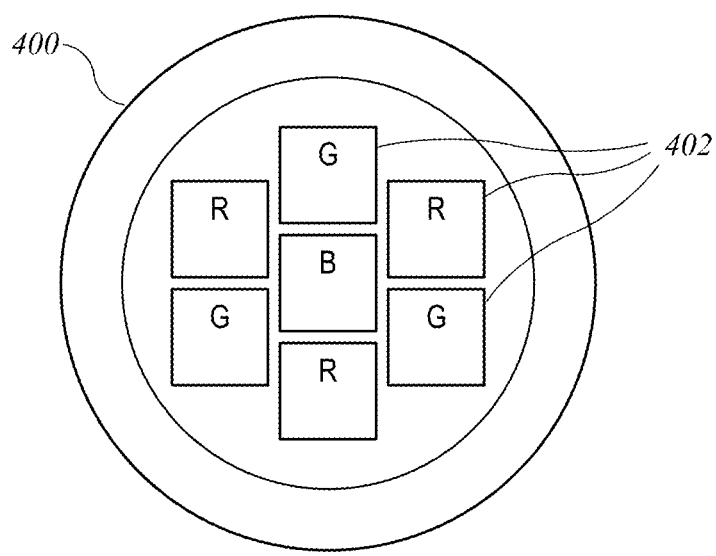
FIGS. 4A-4D show simplified top views of LED arrangements according to various embodiments of the present invention.
Figure 4B:
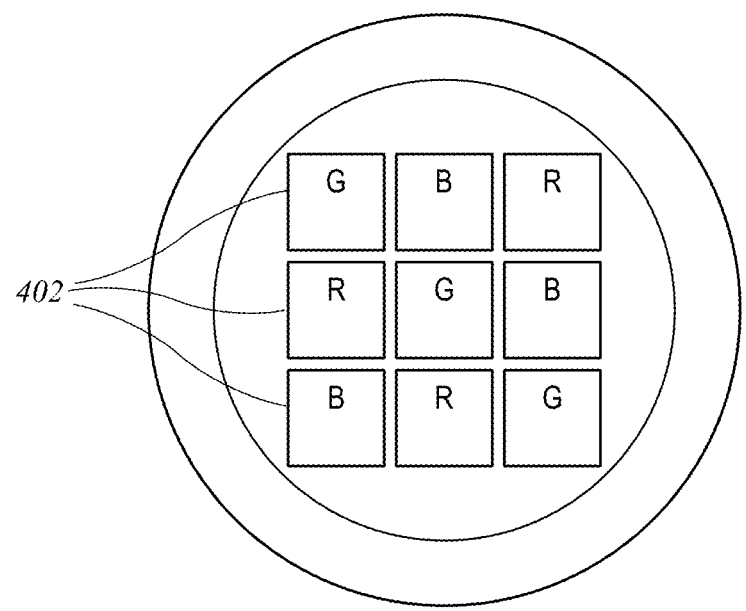

LEDs belonging to these three groups can be arranged on an emitter. FIGS. 4A-4D show simplified top views of LED arrangements according to various embodiments of the present invention. FIG. 4A shows a seven-die configuration, FIG. 4B a nine-die configuration, FIG. 4C a twelve-die configuration, and FIG. 4D a twenty-five-die configuration. Each view is similar to that of FIG. 1B described above, except that only the recess region and the LED die locations are shown. Each LED die 402 is labeled by color, with "B" denoting an LED having a blue-dominated spectrum as shown in FIG. 3A, "G" denoting an LED having a green/yellow-dominated spectrum as shown in FIG. 3B, and "R" denoting an LED having a narrow red spectrum as shown in FIG. 3C.

In the emitter configuration of any of FIGS. 4A-4D, each color group (R, G, and B) can be independently addressable, as described above. This allows the color of the emitter to be tuned by adjusting the relative current supplied to each group. FIG. 5 shows a CIE color-space diagram for LED groups that produce spectra as shown in FIGS. 3A-3D. The blue LED group produces light at approximately point 502, the green LED group produces light at approximately point 504, and the red LED group produces light at approximately point 506. Curve 510 corresponds to the blackbody locus, for color temperatures (CCT) from 1500 K to 10,000 K. By adjusting the relative current among the three LED groups, the emitter can be tuned to produce light at any point within triangle 512, which includes any point along blackbody curve 510 from below 2700 K to above 6000 K.

FIGS. 6A-6D are graphs showing representative spectra obtained for the LED groups of FIG. 5 when tuned to various CCT points along the blackbody curve. FIG. 6A corresponds to a CCT of about 3000 K, FIG. 6B to a CCT of about 4000 K, FIG. 6C to a CCT of about 5000 K, and FIG. 6D to a CCT of about 6000 K.

Figure 4C:
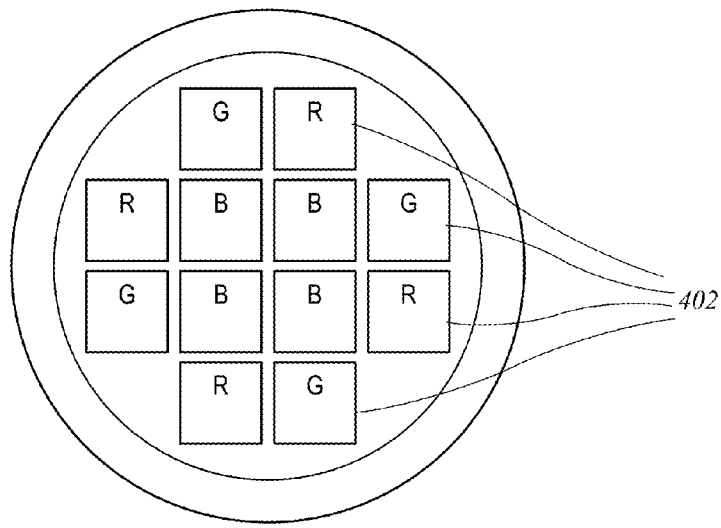
Figure 4D:
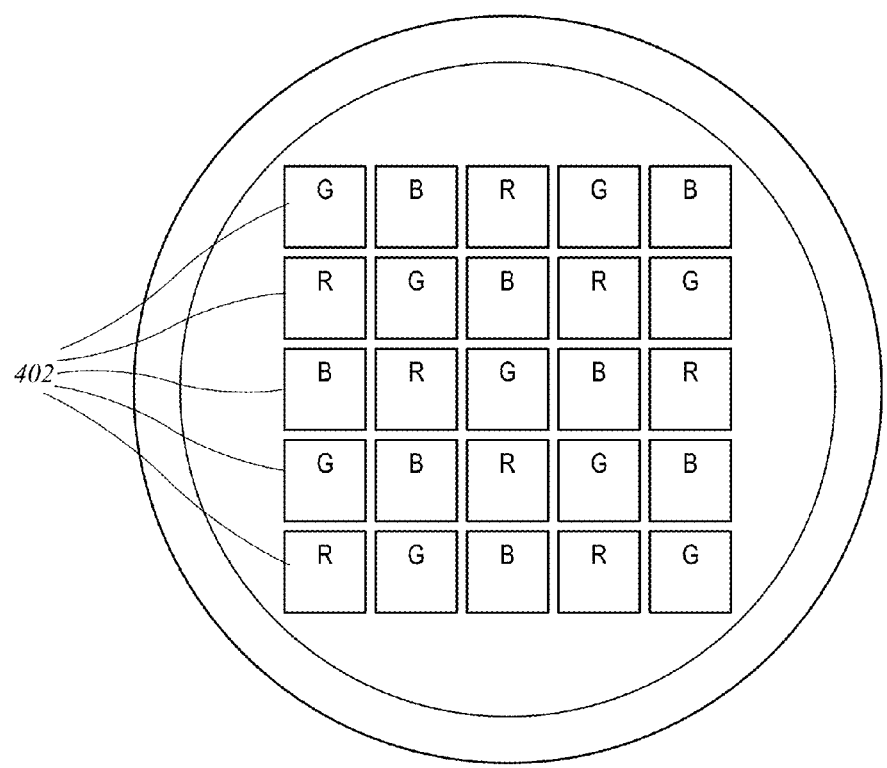
Figure 5:
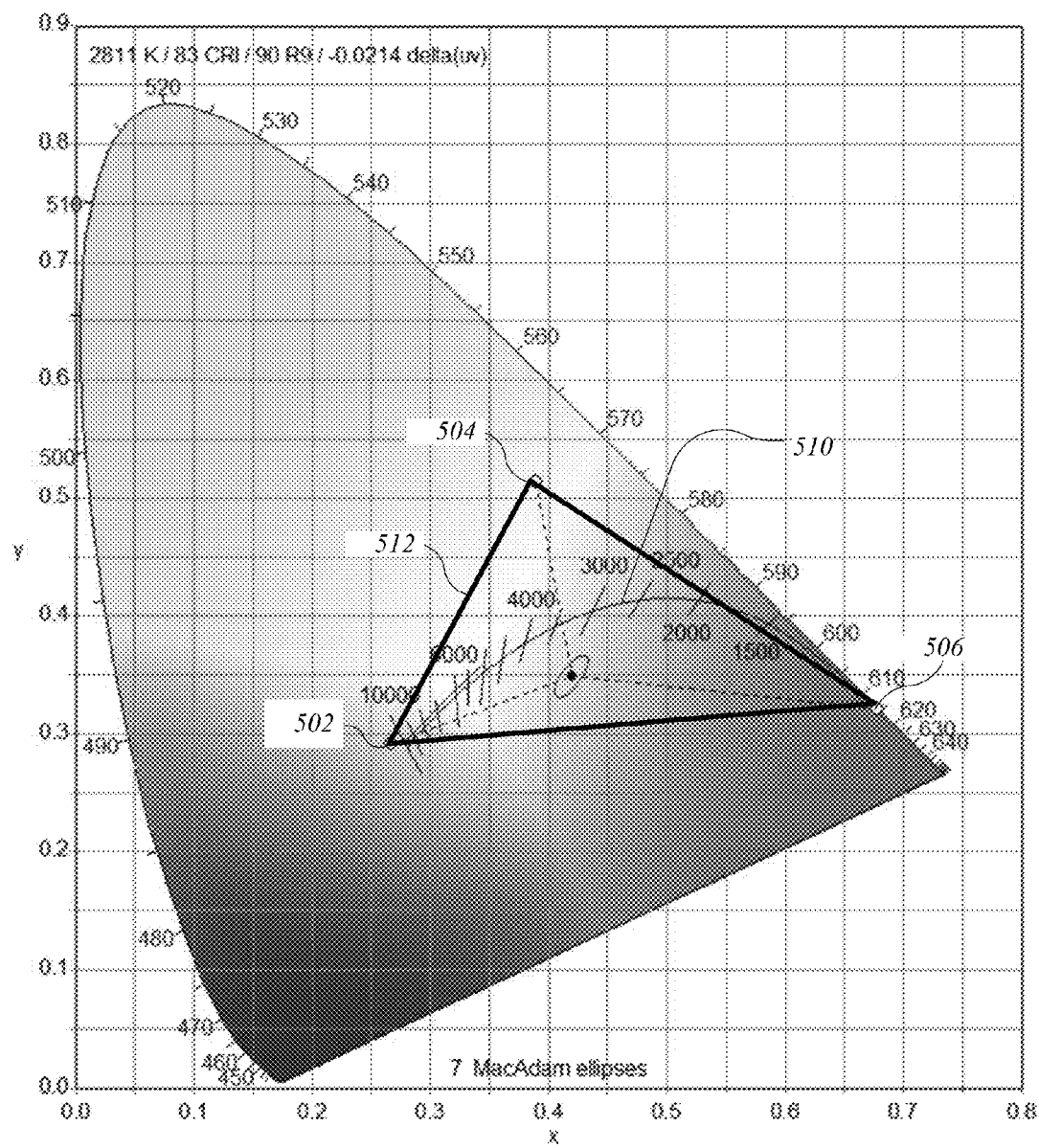
FIG. 5 shows a CIE color-space diagram for LED groups that produce spectra as shown in FIGS. 3A-3C.

FIG. 7A shows a table of CRI measurements and CRI components for the LED groups of FIG. 5 in a 12-die configuration similar to FIG. 4C, at various CCT from 2189 K to 6112 K. Du'v' represents the deviation in CIE color space coordinates from the blackbody locus. CRI represents the measured color rendering index (on a standard 0-100 scale), and R1-R15 represent measurements for the specific color samples contributing to the CRI. As can be seen, within the range from 2700 K to 6000 K, CRI exceeds 90, and R9 exceeds 80.

FIG. 7B shows a table of the CRI measurements of FIG. 7A as well as visible light emission (lumens) for the LED groups of FIG. 5 at various CCT from 2189 K to 6112 K. At 100% intensity at CCT of 3000 K and input voltage of 24 volts (DC), one embodiment of the emitter can operate at an efficiency of 44 lumens/watt and a case temperature Tc of 65° C.

Example 2

Figure 8A:
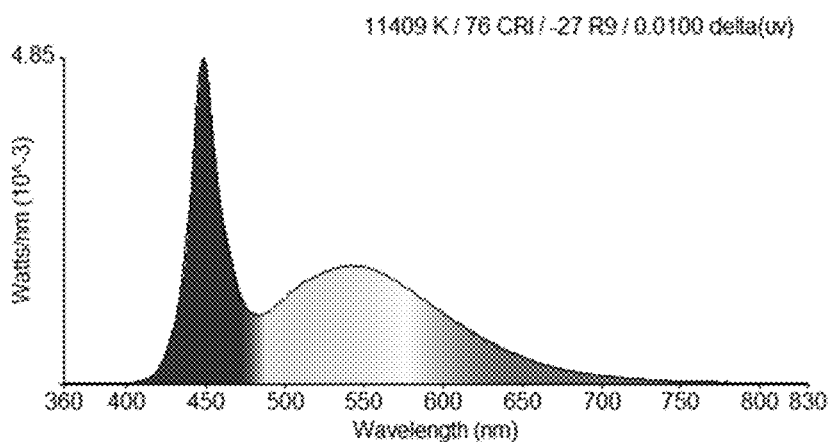
FIGS. 8A-8C show spectra for LED groups in a emitter according to a second example embodiment of the present invention.
Figure 8B:
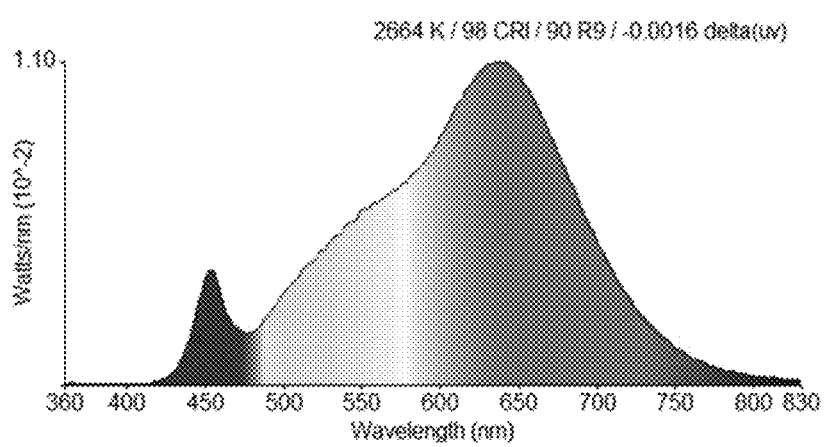
Figure 8C:
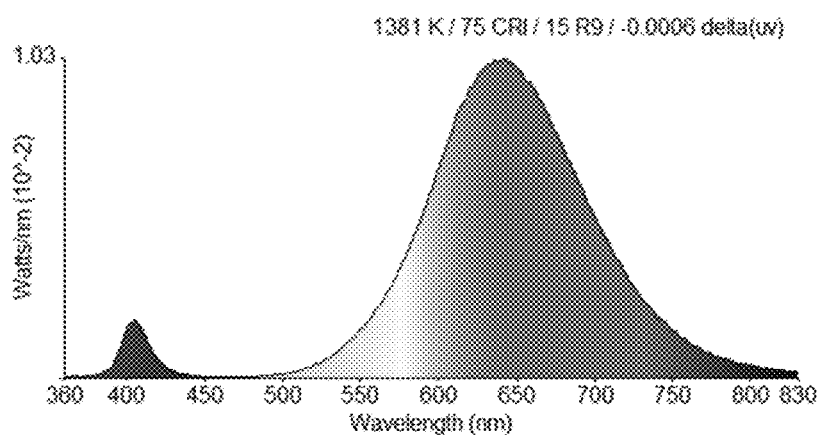

A second example of an emitter according to an embodiment of the present invention also includes three groups of LEDs that produce different spectra, as shown in FIGS. 8A-8C. A spectrum as shown in FIG. 8A can be produced by a first (blue) LED group in which each LED consists of a 455-nm blue LED chip coated with GAL535 phosphor at a low concentration, such that the spectrum remains predominantly blue. A spectrum as shown in FIG. 8B can be produced by a second (warm white) LED group in which each LED consists of a "WW 2700K" chip made from a 455-nm blue LED chip coated with a mixture of GAL 535 phosphor and red nitride phosphor that produces a broad spectrum (FWHM about 130 nm) with a peak near 620 nm. The spectrum shown in FIG. 8B can appear to the human eye as a warm white light with color temperature around 2700 K. A spectrum as shown in FIG. 8C can be produced by a third (red) LED group in which each LED consists of a 405-nm (near-UV) LED chip coated with a VR phosphor (a red nitride phosphor that can be efficiently excited by ultraviolet (UV) wavelengths) that produces a broad spectrum dominated by red wavelengths (roughly 630-700 nm). It is to be understood that other combinations of LED chips and phosphors can be substituted.

Figure 9A:
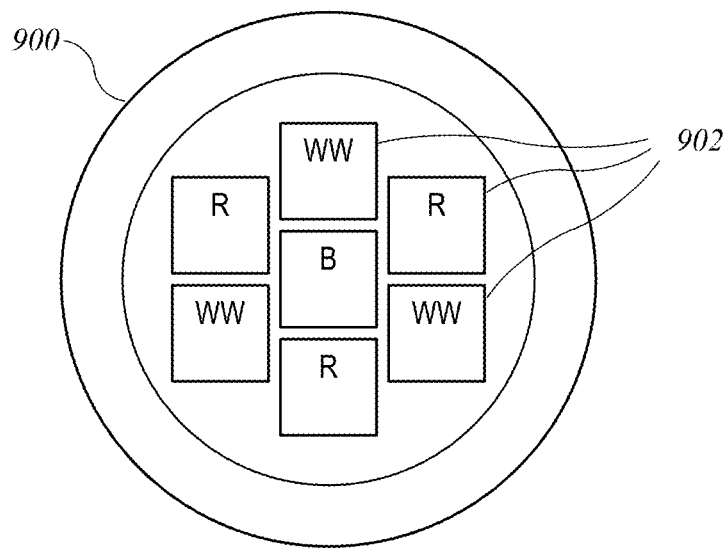
FIGS. 9A-9D show simplified top views of LED arrangements according to various embodiments of the present invention.
Figure 9B:
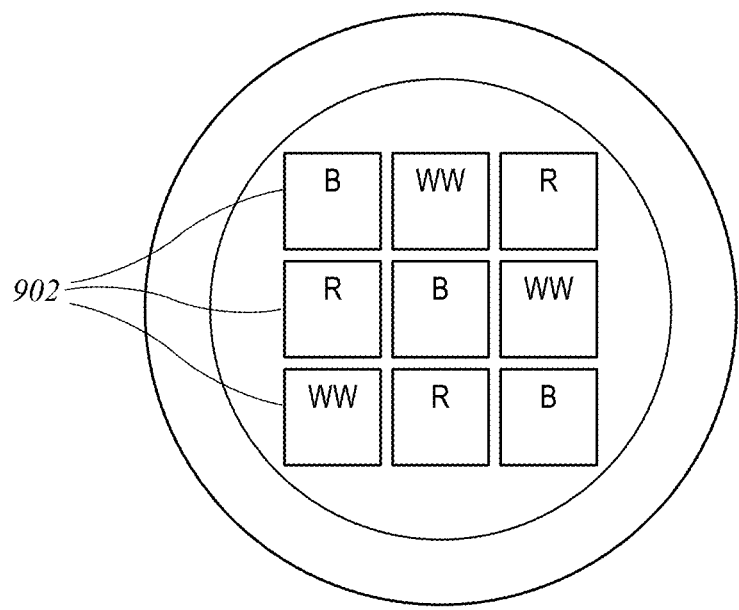

LEDs belonging to these three groups can be arranged on an emitter. FIGS. 9A-9D show simplified top views of LED arrangements according to various embodiments of the present invention. FIG. 9A shows a seven-die configuration, FIG. 9B a nine-die configuration, FIG. 9C a twelve-die configuration, and FIG. 9D a twenty-five-die configuration. Each view is similar to that of FIG. 1B described above, except that only the recess region and the LED die locations are shown. Each LED die 902 is labeled by color, with "B" denoting an LED having a blue-dominated spectrum as shown in FIG. 8A, "WW" denoting an LED having a warm white spectrum as shown in FIG. 8B, and "R" denoting an LED having a red-dominated spectrum as shown in FIG. 8C.

In the arrangement of any of FIGS. 9A-9D, each color group (R, WW, and B) can be independently addressable, as described above. This allows the color of the emitter to be tuned by adjusting the relative current supplied to each group. FIG. 10 shows a CIE color-space diagram for LED groups that produce spectra as shown in FIGS. 9A-9D. The blue LED group produces light at approximately point 1002, the warm white LED group produces light at approximately point 1004, and the red LED group produces light at approximately point 1006. Curve 1010 corresponds to the blackbody locus, for CCT from 1500 K to 10,000 K. By adjusting the relative current among the three LED groups, the emitter can be tuned to produce light at any point within triangle 1012, which is close to blackbody curve 1010 from at least 2700 K to above 6000 K.

FIGS. 11A-11D illustrate representative spectra obtained for the LED groups of FIG. 10 at various CCT points along the blackbody curve. FIG. 11A corresponds to a CCT of about 2700 K, FIG. 11B to a CCT of about 4000 K, FIG. 11C to a CCT of about 5000 K, and FIG. 11D to a CCT of about 6000 K.

Figure 9C:
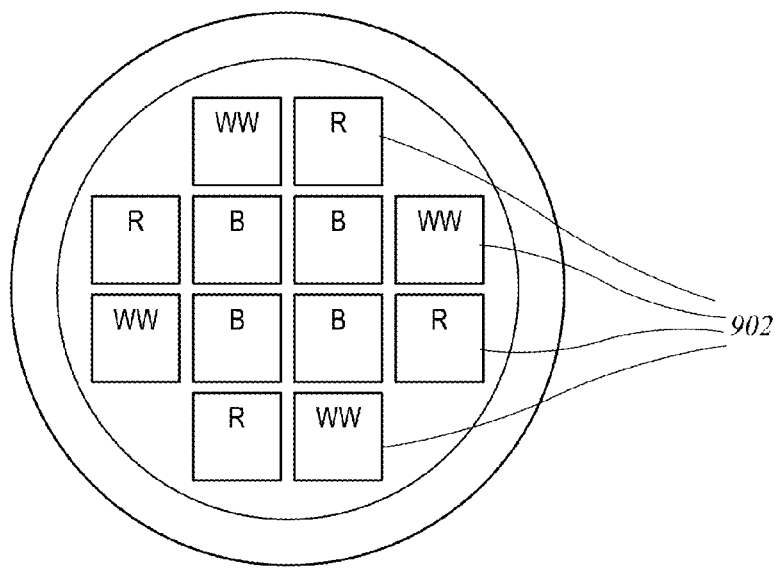
Figure 9D:
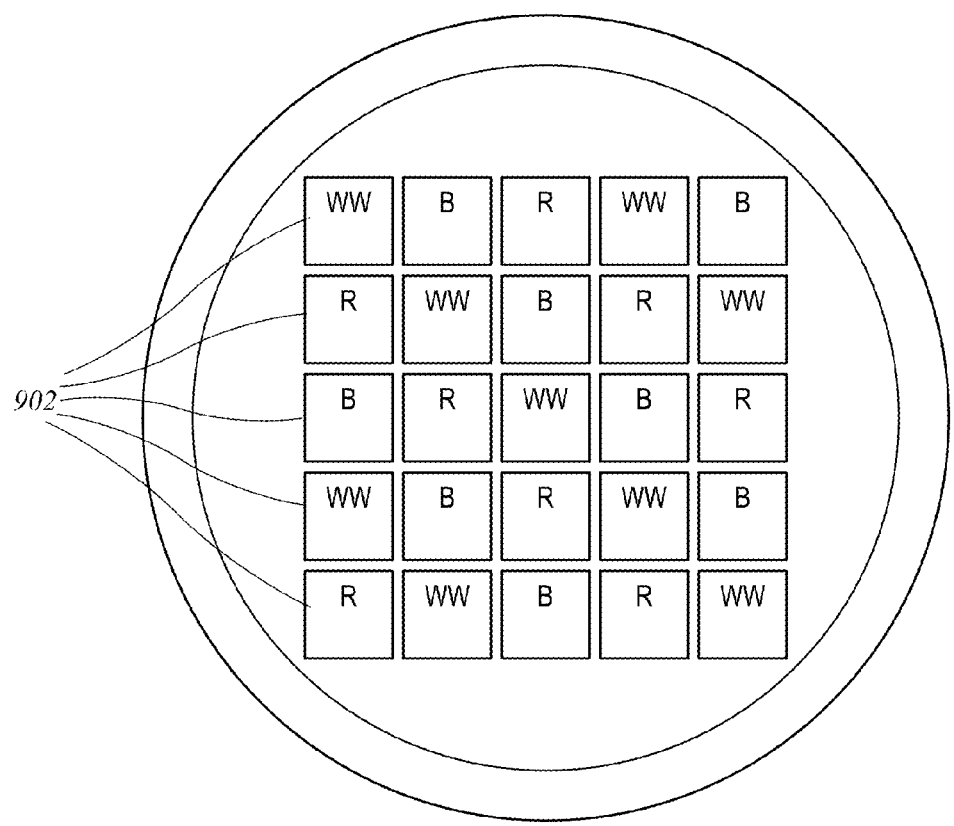
Figure 10:
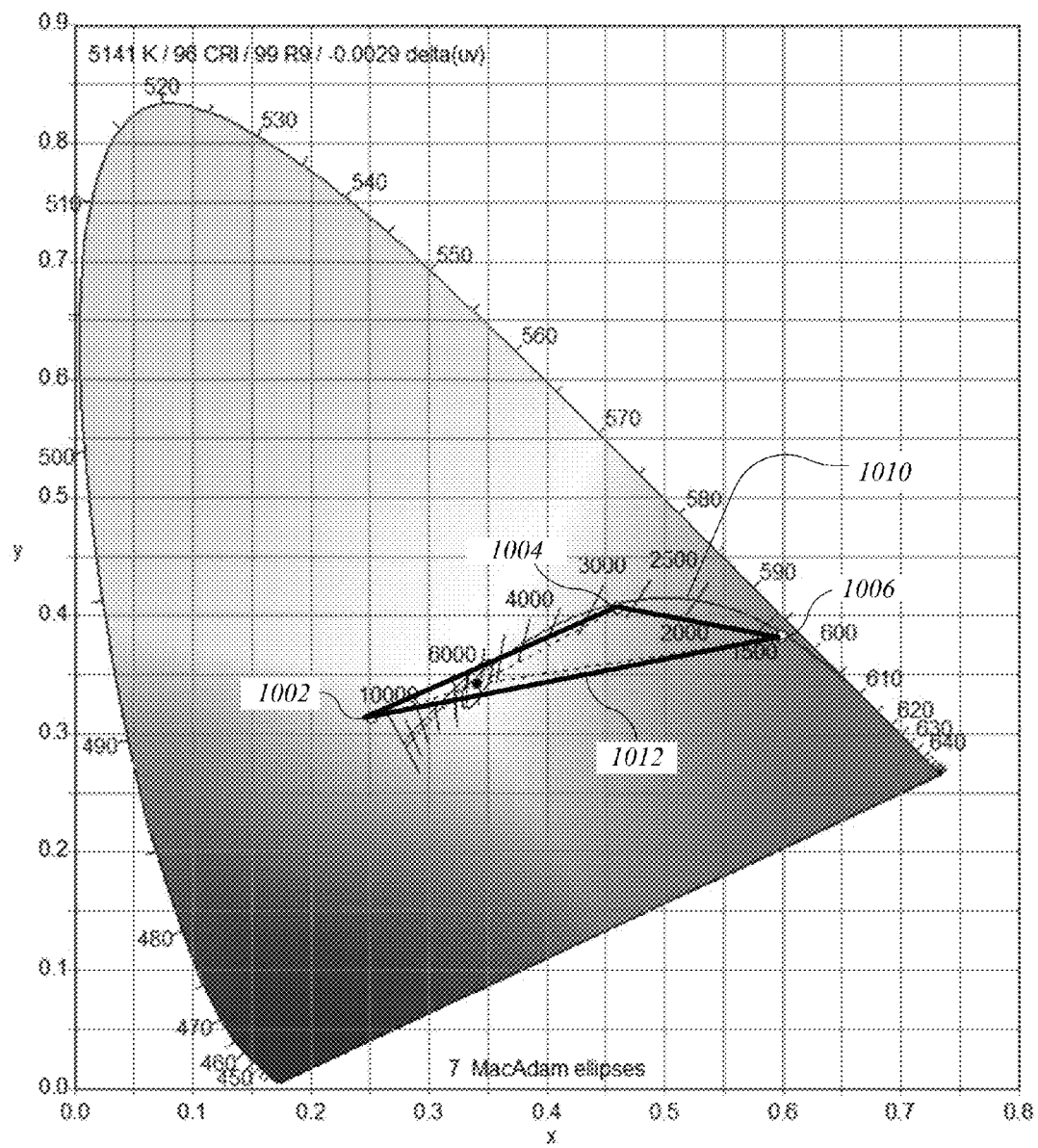
FIG. 10 shows a CIE color-space diagram for LED groups that produce spectra as shown in FIGS. 8A-8C.

FIG. 12A shows a table of CRI measurements for the LED groups of FIG. 1 in a 12-die configuration similar to FIG. 9C, at various CCT from 2635 K to 6147 K. Du'v' represents the deviation in CIE color space coordinates from the blackbody locus. CRI represents the overall color rendering index, and R1-R15 represent the specific color samples that contribute to CRI. As can be seen, within the range from 2700 K to 6000 K, CRI exceeds 96, and R9 exceeds 90.

FIG. 12B shows a table of the CRI measurements of FIG. 7A as well as visible light emission (lumens) for the LED groups of FIG. 10 at various CCT from 2635 K to 6147 K. At 100% intensity at CCT of 3000 K and input voltage of 24 volts (DC), one embodiment of the emitter can operate at an efficiency of 29 lumens/watt and a case temperature Tc of 65° C.

Example 3

Figure 13A:
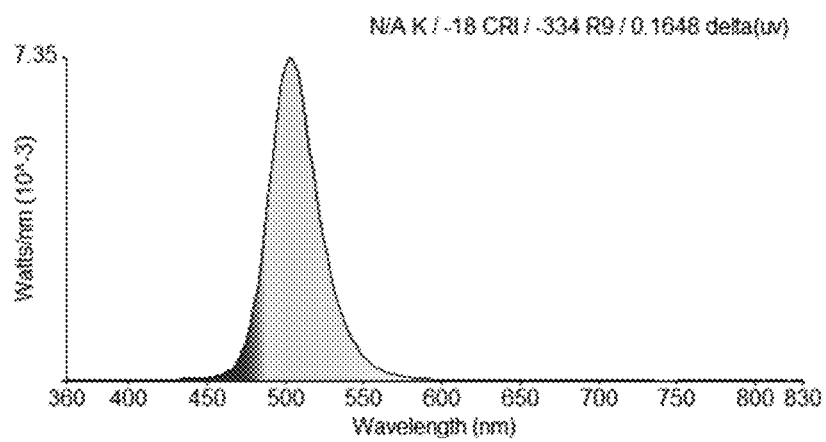
FIGS. 13A-13D show spectra for LED groups in a emitter according to a third example embodiment of the present invention.
Figure 13B:
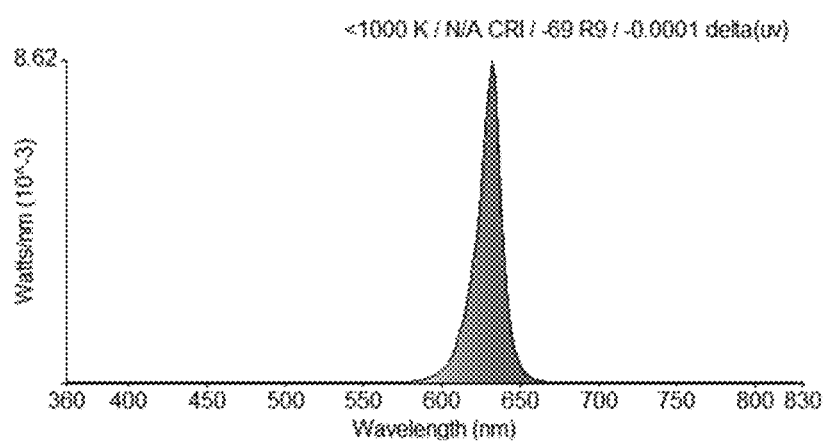
Figure 13C:
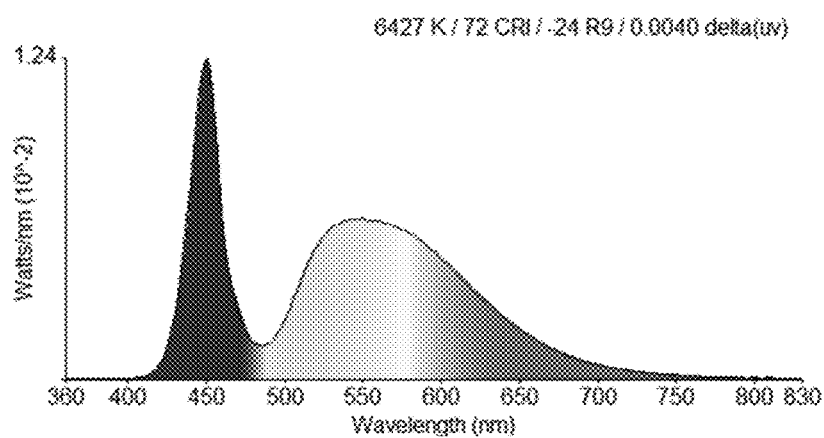
Figure 13D:
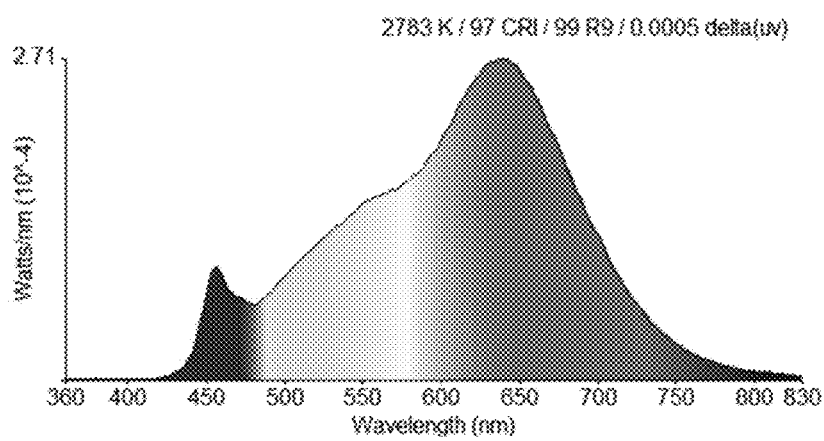

A third example of an emitter according to an embodiment of the present invention includes four groups of LEDs that produce different spectra, as shown in FIGS. 13A-13D. A spectrum as shown in FIG. 13A can be produced by a first (cyan) LED group in which each LED consists of a cyan-colored LED chip having a peak wavelength at approximately 505 nm. A spectrum as shown in FIG. 13B can be produced by a second (red) LED group in which each LED consists of a red LED chip having a peak wavelength of approximately 621 nm. A spectrum as shown in FIG. 13C can be produced by a third (cool white) group in which each LED consists of a "CW" chip made from a 455-nm blue LED chip coated with YAG phosphor that produces a broad spectrum green-red light (FWHM about 130 nm) with a strong blue peak. The spectrum shown in FIG. 13C can appear to the human eye as a cool white light with color temperature around 6400 K. A spectrum as shown in FIG. 13D can be produced by a fourth (warm white) LED group in which each LED consists of a WW 2700K chip (e.g., as described above) that produces a broad spectrum (FWHM about 130 nm) with a peak near 620 nm. The spectrum shown in FIG. 13D can appear to the human eye as a warm white light with color temperature around 2700 K. It is to be understood that other combinations of LED chips and phosphors can be substituted.

Figure 14A:
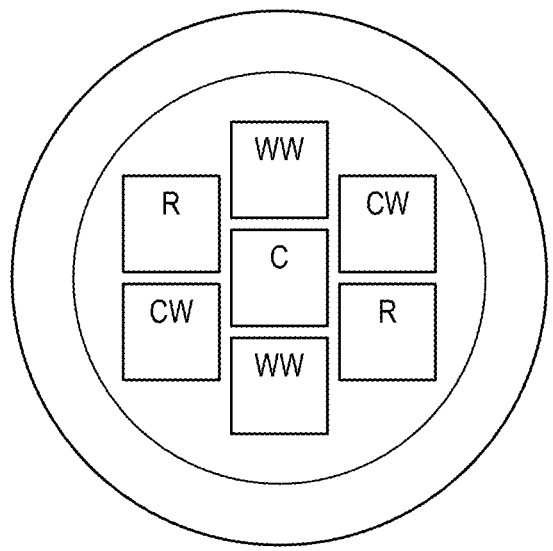
FIGS. 14A-14D show simplified top views of LED arrangements according to various embodiments of the present invention.
Figure 14B:
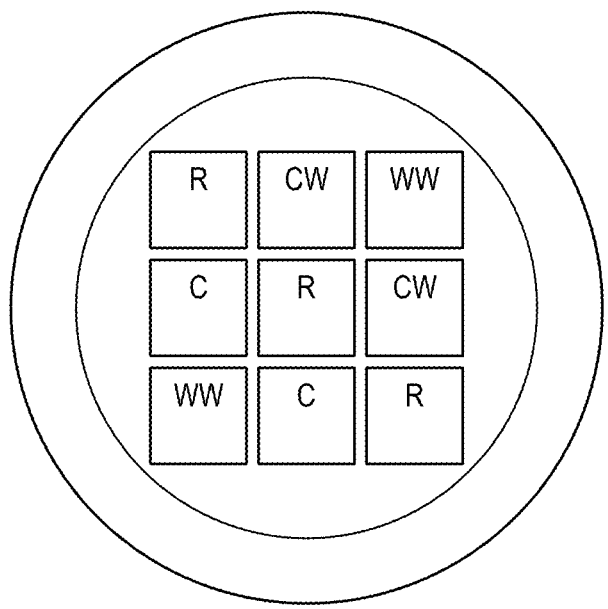

LEDs belonging to these four groups can be arranged on an emitter. FIGS. 14A-14D show simplified top views of LED arrangements according to various embodiments of the present invention. FIG. 14A shows a seven-die configuration, FIG. 14B a nine-die configuration, FIG. 14C a twelve-die configuration, and FIG. 14D a twenty-five-die configuration. Each view is similar to that of FIG. 1B described above, with only the recess region and the LED die locations shown. Each LED die 902 is labeled by color, with "C" denoting a cyan LED as shown in FIG. 13A, "R" denoting a red LED as shown in FIG. 13B, "CW" denoting an LED having a cool-white spectrum as shown in FIG. 13C, and "WW" denoting an LED having a warm white spectrum as shown in FIG. 13D.

In the arrangement of any of FIGS. 14A-14D, each color group (C, R, CW, and WW) can be independently addressable, as described above. This allows the color of the emitter to be tuned by adjusting the relative current supplied to each group. FIG. 15 shows a CIE color-space diagram for the LED groups of FIGS. 14A-14D. The cyan LED group produces light at approximately point 1502, the red LED group produces light at approximately point 1504, the cool white LED group produces light at approximately point 1506, and the warm white LED group produces light at approximately point 1508. Curve 1510 corresponds to the blackbody locus, for CCT from 1500 K to 10,000 K. By adjusting the relative current among the four LED groups, the emitter can be tuned to produce light at any point within triangle 1512, which includes points along blackbody curve 1510 from at least 2700 K to above 6000 K.

FIGS. 16A-16D illustrate representative spectra obtained for the LED groups of FIG. 15 at various CCT points along the blackbody curve. FIG. 16A corresponds to a CCT of about 3000 K, FIG. 16B to a CCT of about 4000 K, FIG. 16C to a CCT of about 5000 K, and FIG. 16D to a CCT of about 6000 K.

Figure 14C:
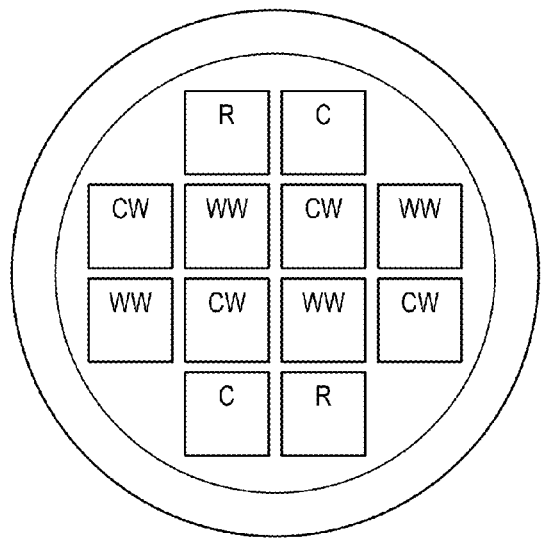
Figure 14D:
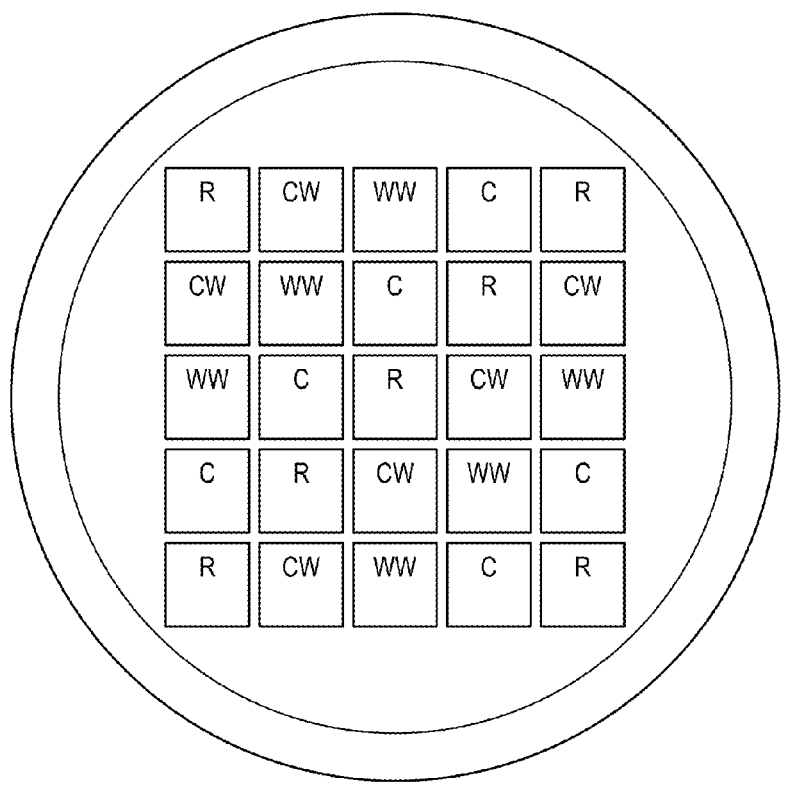
Figure 15:
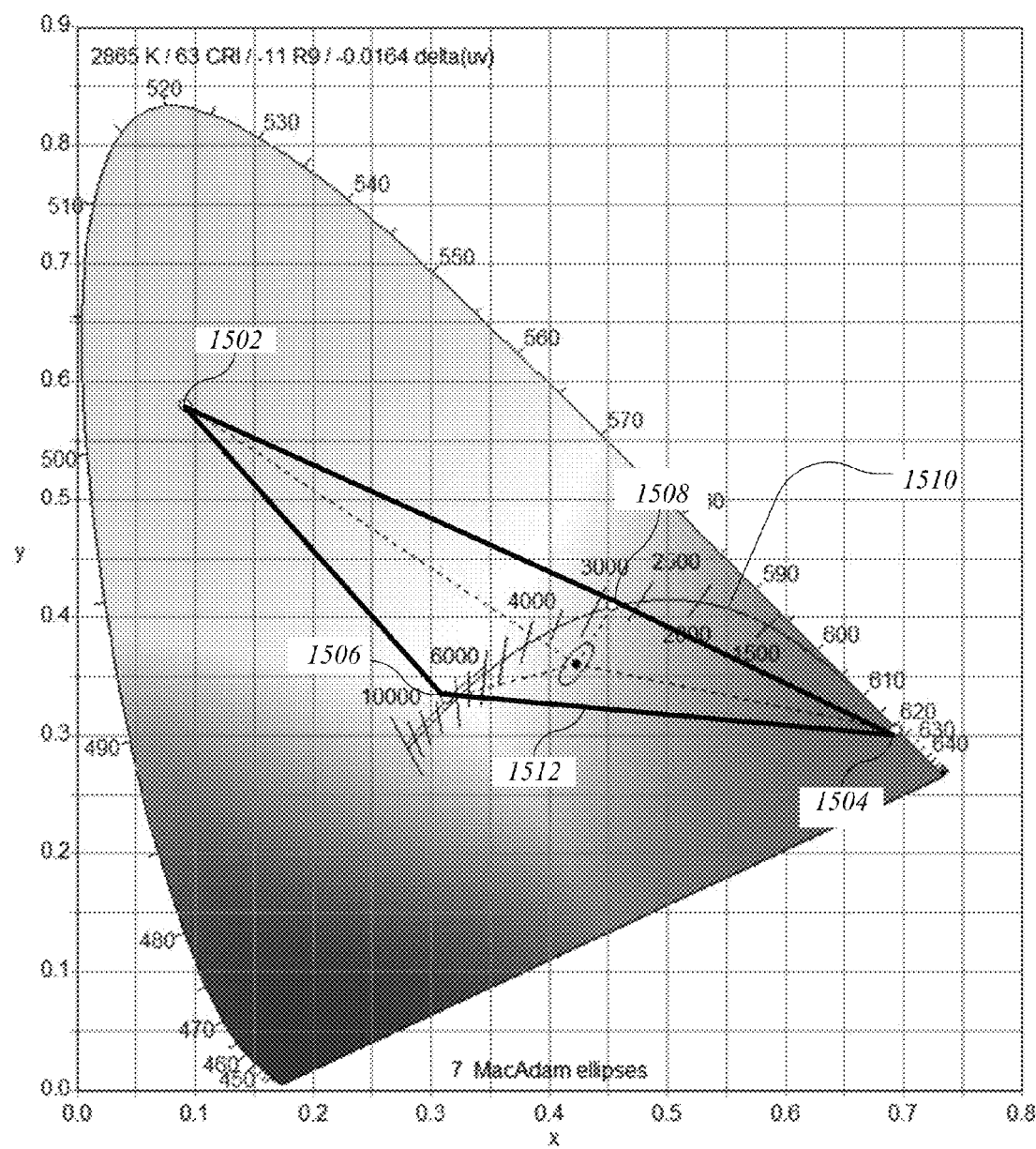
FIG. 15 shows a CIE color-space diagram for LED groups that produce spectra as shown in FIGS. 13A-13D.

FIG. 17A shows a table of CRI measurements for the LED groups of FIG. 15 in a 12-die configuration similar to FIG. 14C, at various CCT from 2787 K to 6017 K. Du'v' represents the deviation in CIE color space coordinates from the blackbody locus. CRI represents the overall color rendering index, and R1-R15 represent the specific color samples that contribute to CRI. As can be seen, within the range from 2700 K to 6000 K, CRI exceeds 94, and R9 also exceeds 94.

FIG. 17B shows a table of the CRI measurements of FIG. 17A as well as visible light emission (lumens) for the LED groups of FIG. 15 at various CCT from 2787 K to 6017 K. At 100% intensity at CCT of 3000 K and input voltage of 24 volts (DC), one embodiment of the emitter can operate at an efficiency of 28 lumens/watt and a case temperature Tc of 65° C.

Emitter Operation

It is to be understood that the emitters according to embodiments of the present invention, including any of the example emitters described above, can be dynamically tunable during user operation, to a desired color or CCT within the tuning range (e.g., as shown in FIGS. 5, 10, and 15). As described above, the electrical connections through the ceramic substrate can be arranged such that each LED group is independently addressable. Accordingly, tuning to a desired color or CCT can be achieved by controlling the relative operating currents supplied to the different LED groups. In some embodiments, an automated system can be used to determine the ratio of currents required to obtain a particular desired color temperature, and a color-mixing lookup table can be constructed that specifies the current ratios to be used for a given color temperature. In a manufacturing environment where the color of light produced by a given LED group is reliably consistent from one device to the next, the same lookup table can be applied to all devices manufactured in that environment. Where the color of light is more variable, an automated process and system can be used to determine a lookup table for each emitter, e.g., as part of an emitter manufacturing process. Examples of suitable processes and systems are described in U.S. Patent App. Pub. No. 2012/0286699; other processes and systems can also be used. The lookup table can be provided to a control circuit that generates the currents supplied to the LEDs. In some embodiments, the emitter can include an onboard memory circuit (e.g., an EPROM or the like) that stores the lookup table and that can be read by a control circuit. The control circuit can be onboard the emitter or an external control circuit as desired. In still other embodiments, the lookup table can be supplied to an external control circuit without being stored on the emitter.

While the invention has been described with respect to specific embodiments, one skilled in the art will recognize that numerous modifications are possible. The particular LED chips and phosphor coatings can be varied. Various embodiments can include more or fewer groups of LEDs.

Thus, although the invention has been described with respect to specific embodiments, it will be appreciated that the invention is intended to cover all modifications and equivalents within the scope of the following claims.

What is claimed is:

1. An emitter package comprising:
a single ceramic substrate having a recess region formed on a top surface thereof and a plurality of bonding pads disposed within the recess region; and
a plurality of LED chips disposed within the recess region and bonded to the bonding pads,
wherein the ceramic substrate further includes a plurality of electrical paths disposed at least partially within the body of the ceramic substrate, the electrical paths electrically connecting the LED chips into three independently addressable groups,
the three independently addressable groups including:
a first group consisting of one or more blue LED chips coated with a first broad-spectrum phosphor material having at least 120 nm FWHM at a first concentration to produce light having a predominantly blue spectrum;
a second group consisting of one or more blue LED chips coated with a mixture of a second broad-spectrum phosphor material and a red nitride phosphor to produce light having a warm white color; and
a third group consisting of one or more near-ultraviolet LED chips coated with a red nitride phosphor to produce light having a spectrum dominated by red wavelengths,
wherein the emitter package is tunable to produce light in a range of color temperatures (CCT) from 2700 K to 6000 K with a color rendering index (CRI) of at least 90 at every CCT within the range of CCT from 2700 K to 6000 K.

2. The emitter package of claim 1 further comprising:
a primary optical element disposed over the recess region and sealed to the recess region to protect the LED chips.

3. The emitter package of claim 1 wherein the light produced by the emitter package has a CRI of at least 95 at every CCT within the range from 2700 K to 6000 K.

4. The emitter package of claim 1 wherein the light produced by the emitter package has R9 of at least 80 at every CCT within the range from 2700 K to 6000 K.

5. The emitter package of claim 1 wherein the light produced by the emitter package has R9 of at least 90 at every CCT within the range from 2700 K to 6000 K.

6. The emitter package of claim 1 wherein the light produced by the emitter package has R9 of at least 94 at every CCT within the range from 2700 K to 6000 K.

7. The emitter package of claim 1 wherein each of the three independently addressable groups includes the same number of LED chips.

8. The emitter package of claim 1 wherein two of the three independently addressable groups include a first number of LED chips and the third group includes a second number of LED chips, the second number differing by one from the first number.

9. The emitter package of claim 1 wherein the blue LED chips are 455-nm blue LED chips.

10. The emitter package of claim 1 wherein the warm white color produced by the second group of LED chips has a CCT of approximately 2700 K.

11. The emitter package of claim 1 wherein the near-ultraviolet LED chips are 405-nm LED chips.

12. An emitter package comprising:
a single ceramic substrate having a recess region formed on a top surface thereof and a plurality of bonding pads disposed within the recess region; and
a plurality of LED chips disposed within the recess region and bonded to the bonding pads,
wherein the ceramic substrate further includes a plurality of electrical paths disposed at least partially within the body of the ceramic substrate, the electrical paths electrically connecting the LED chips into four independently addressable groups,
the four independently addressable groups including:
a first group consisting of one or more cyan LED chips;
a second group consisting of one or more red LED chips;
a third group consisting of one or more blue LED chips coated with a first broad-spectrum phosphor material having at least 120 nm FWHM to produce light having a cool white color; and
a fourth group consisting of one or more blue LED chips coated with a mixture of a second broad-spectrum phosphor material and a red nitride phosphor to produce light having a warm white color,
wherein the emitter package is tunable to produce light in a range of color temperatures (CCT) from 2700 K to 6000 K with a color rendering index (CRI) of at least 90 at every CCT within the range of CCT from 2700 K to 6000 K.

13. The emitter package of claim 12 wherein each of the four independently addressable groups includes the same number of LED chips.

14. The emitter package of claim 12 wherein three of the four independently addressable groups each include a first number of LED chips and the fourth group includes a second number of LED chips, the second number differing by one from the first number.

15. The emitter package of claim 12 wherein the cyan LED chips have a peak wavelength at approximately 505 nm.

16. The emitter package of claim 12 wherein the red LED chips have a peak wavelength at approximately 621 nm.

17. The emitter package of claim 12 wherein the first broad-spectrum phosphor material is a YAG phosphor material.

18. The emitter package of claim 12 wherein the cool white color produced by the third group of LED chips has a CCT of approximately 6400 K.

19. The emitter package of claim 12 wherein the warm white color produced by the fourth group of LED chips has a CCT of approximately 2700 K.

* * * * *